(12) United States Patent
Oh et al.

(10) Patent No.: US 12,451,474 B2
(45) Date of Patent: Oct. 21, 2025

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Dongjoon Oh, Suwon-si (KR); Unbyoung Kang, Hwaseong-si (KR); Byeongchan Kim, Asan-si (KR); Jumyong Park, Cheonan-si (KR); Solji Song, Suwon-si (KR); Chungsun Lee, Asan-si (KR); Hyunsu Hwang, Siheung-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 608 days.

(21) Appl. No.: 17/826,521

(22) Filed: May 27, 2022

(65) Prior Publication Data

US 2023/0112006 A1    Apr. 13, 2023

(30) Foreign Application Priority Data

Oct. 12, 2021  (KR) .......................... 10-2021-0135302

(51) Int. Cl.
*H01L 25/18*    (2023.01)
*H01L 23/00*    (2006.01)
(Continued)

(52) U.S. Cl.
CPC ............ *H01L 25/18* (2013.01); *H01L 23/481* (2013.01); *H01L 24/05* (2013.01); *H01L 24/08* (2013.01);
(Continued)

(58) Field of Classification Search
CPC ........ H01L 25/18; H10B 80/00; H10K 19/00; H10K 39/10; H10K 39/12; H10K 39/15;
(Continued)

(56) References Cited

U.S. PATENT DOCUMENTS 8,314,483 B2    11/2012  Lin et al.
9,768,147 B2     9/2017  Gandhi et al.
(Continued)

FOREIGN PATENT DOCUMENTS

JP    2020-123697 A     8/2020
KR   10-2012-0126370 A  11/2012
(Continued)

*Primary Examiner* — Eliseo Ramos Feliciano
*Assistant Examiner* — Brad A Knudson
(74) *Attorney, Agent, or Firm* — Wolf, Greenfield & Sacks, P.C.

(57) ABSTRACT

A semiconductor package includes: a first semiconductor chip including a first semiconductor substrate including a first active surface and a first inactive surface opposite to each other and a plurality of first chip pads on the first active surface; a second semiconductor chip including a second semiconductor substrate including a second active surface and a second inactive surface opposite to each other and a plurality of second chip pads on the second active surface, the second active surface being stacked on the first semiconductor chip to face the first inactive surface; a bonding insulation material layer interposed between the first semiconductor chip and the second semiconductor chip; and a plurality of bonding pads surrounded by the bonding insulation material layer to electrically connect the first semiconductor chip to the second semiconductor chip.

19 Claims, 32 Drawing Sheets

(51) Int. Cl.
*H01L 23/48* (2006.01)
*H10B 80/00* (2023.01)

(52) U.S. Cl.
CPC .............. *H01L 24/09* (2013.01); *H01L 24/29* (2013.01); *H01L 24/32* (2013.01); *H10B 80/00* (2023.02); *H01L 2224/05647* (2013.01); *H01L 2224/08146* (2013.01); *H01L 2224/09519* (2013.01); *H01L 2224/29186* (2013.01); *H01L 2224/32145* (2013.01); *H01L 2225/06541* (2013.01); *H01L 2225/06589* (2013.01); *H01L 2924/05442* (2013.01)

(58) Field of Classification Search
CPC .... H10K 39/18; H10K 39/601; H10K 39/621; H10K 59/90; H10K 59/95; H10K 65/00; H10N 19/00; H10N 39/00; H10N 59/00; H10N 69/00; H10N 79/00; H10N 89/00
See application file for complete search history.

(56) References Cited

U.S. PATENT DOCUMENTS

| | | |
|---|---|---|
| 10,163,864 B1 | 12/2018 | England |
| 10,867,879 B2 | 12/2020 | Yu et al. |
| 10,910,357 B2 | 2/2021 | Shih |
| 2010/0187670 A1* | 7/2010 | Lin ..................... H01L 23/3677 257/E23.101 |
| 2015/0221612 A1* | 8/2015 | Gandhi ................... H01L 24/03 257/774 |
| 2019/0221520 A1* | 7/2019 | Kim ....................... H01L 24/06 |
| 2021/0020596 A1 | 1/2021 | Yi et al. |
| 2021/0066222 A1* | 3/2021 | Chen ................ H01L 21/76879 |
| 2021/0225708 A1* | 7/2021 | Lee ......................... H01L 25/18 |

FOREIGN PATENT DOCUMENTS

| | | |
|---|---|---|
| KR | 10-2021-0008917 A | 1/2021 |
| KR | 10-2021-0048638 A | 5/2021 |

* cited by examiner

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 10-2021-0135302, filed on Oct. 12, 2021, in the Korean Intellectual Property Office, the disclosure of which is incorporated by reference herein in its entirety.

BACKGROUND

1. Field

Embodiments relate to a semiconductor package and a method of manufacturing the same.

2. Description of the Related Art

As a small size, large capacity, and high performance of electronic products are needed, there is a need to increase the degree of integration and the speed of semiconductor packages. To this end, semiconductor packages including a plurality of semiconductor chips including stacked semiconductor chips and a method of manufacturing a semiconductor package are being developed.

SUMMARY

Embodiments are directed to a semiconductor package, including a first semiconductor chip including a first semiconductor substrate including a first active surface and a first inactive surface opposite to each other and a plurality of first chip pads disposed on the first active surface, a second semiconductor chip including a second semiconductor substrate including a second active surface and a second inactive surface opposite to each other and a plurality of second chip pads disposed on the second active surface, the second active surface being stacked on the first semiconductor chip to face the first inactive surface, a bonding insulation material layer disposed between the first semiconductor chip and the second semiconductor chip, and a plurality of bonding pads surrounded by the bonding insulation material layer to electrically connect the first semiconductor chip to the second semiconductor chip, wherein each of the plurality of bonding pads includes a pad portion disposed on each of the plurality of second chip pads and a through via portion passing through the first semiconductor substrate and having a horizontal width which is less than a horizontal width of the pad portion.

Embodiments are directed to a semiconductor package, including a high bandwidth memory (HBM) control die including a first semiconductor substrate including a first active surface and a first inactive surface opposite to each other and a plurality of first chip pads disposed on the first active surface, a plurality of dynamic random access memory (DRAM) dies each including a second semiconductor substrate including a second active surface and a second inactive surface opposite to each other and a plurality of second chip pads disposed on the second active surface, the second active surface being stacked on the HBM control die to face the first inactive surface and each of the plurality of DRAM dies having a horizontal width which is less than a horizontal width of the HBM control die, a bonding insulation material layer disposed between the HBM control die and each of the plurality of DRAM dies, a plurality of bonding pads surrounded by the bonding insulation material layer to electrically connect the HBM control die to the plurality of DRAM dies, and a plurality of bonding thermal pads surrounded by the bonding insulation material layer, wherein each of the plurality of bonding pads includes a pad portion disposed on each of the plurality of second chip pads to have a first horizontal width and a through via portion passing through at least a portion of the first semiconductor substrate or at least a portion of the second semiconductor substrate and having a second horizontal width which is less than the first horizontal width, and the first horizontal width has a value which is greater than a value of a third horizontal width of each of the plurality of bonding thermal pads.

Embodiments are directed to a semiconductor package, including a first semiconductor chip including a first semiconductor substrate including a first active surface and a first inactive surface opposite to each other, a plurality of first chip pads disposed on the first active surface, and a first inter-wiring insulation layer surrounding the plurality of first chip pads on the first active surface, a plurality of second semiconductor chips each including a second semiconductor substrate including a second active surface and a second inactive surface opposite to each other, a plurality of second chip pads disposed on the second active surface, and a second inter-wiring insulation layer surrounding the plurality of second chip pads on the second active surface, the second active surface being stacked on the first semiconductor chip to face the first inactive surface and each of the plurality of second semiconductor chips having a horizontal width which is less than a horizontal width of the first semiconductor chip, a plurality of bonding insulation material layers disposed between the first inactive surfaces of the plurality of first semiconductor chips and the second inter-wiring insulation layer of a lowermost second semiconductor chip of the plurality of second semiconductor chips and between the second inactive surface and the second inter-wiring insulation layer between the plurality of second semiconductor chips, a plurality of bonding pads surrounded by the bonding insulation material layer to electrically connect the first semiconductor chip to the second semiconductor chip, and a plurality of bonding thermal pads surrounded by the bonding insulation material layer and disposed apart from the plurality of bonding pads in a horizontal direction to each have a first horizontal width, wherein each of the plurality of bonding pads includes a pad portion disposed on each of the plurality of second chip pads to have a second horizontal width which is greater than the first horizontal width and a through via portion passing through at least a portion of the first semiconductor substrate or at least a portion of the second semiconductor substrate and having a third horizontal width having a value corresponding to ½ or less of the second horizontal width, and a portion, surrounding the plurality of bonding pads, of the bonding insulation material layer is thicker than a portion, surrounding the plurality of bonding thermal pads, of the bonding insulation material layer.

Embodiments are directed to a method of manufacturing a semiconductor package, the method including preparing a first semiconductor chip including a first semiconductor substrate including a first active surface and a first inactive surface opposite to each other, a through via passing through at least a portion of the first semiconductor substrate, a first chip pad disposed on the first active surface, and a first inter-wiring insulation layer surrounding the first chip pad on the first active surface, preparing a second semiconductor chip including a second semiconductor substrate including a second active surface and a second inactive surface opposite to each other, a second chip pad disposed on the second active surface, and a second inter-wiring insulation layer surrounding the second chip pad on the second active surface, forming a front insulation material layer covering the second inter-wiring insulation layer, removing a portion of the front insulation material layer and a portion of the second inter-wiring insulation layer to form a first trench at which the second chip pad is exposed and removing another portion of the front insulation material layer to form a second trench apart from the first trench in a horizontal direction, forming a front pad filling the first trench and a front thermal pad layer filling the second trench, removing a portion of the first semiconductor substrate from the first inactive surface so that a portion of the through via protrudes from the first semiconductor substrate, forming a rear insulation material layer, covering a sidewall of a portion of the through via protruding from the first semiconductor substrate and including a third trench, and a rear thermal pad layer filling the third trench, placing the second semiconductor chip on the first semiconductor chip so that the front pad corresponds to the through via and the front thermal pad layer corresponds to the rear thermal pad layer, and bonding the front pad to the through via to form a bonding pad and bonding the front thermal pad layer to the rear thermal pad layer to form a bonding thermal pad.

BRIEF DESCRIPTION OF THE DRAWINGS

Features will become apparent to those of skill in the art by describing in detail example embodiments with reference to the attached drawings in which.

DETAILED DESCRIPTION

Figure 1A:
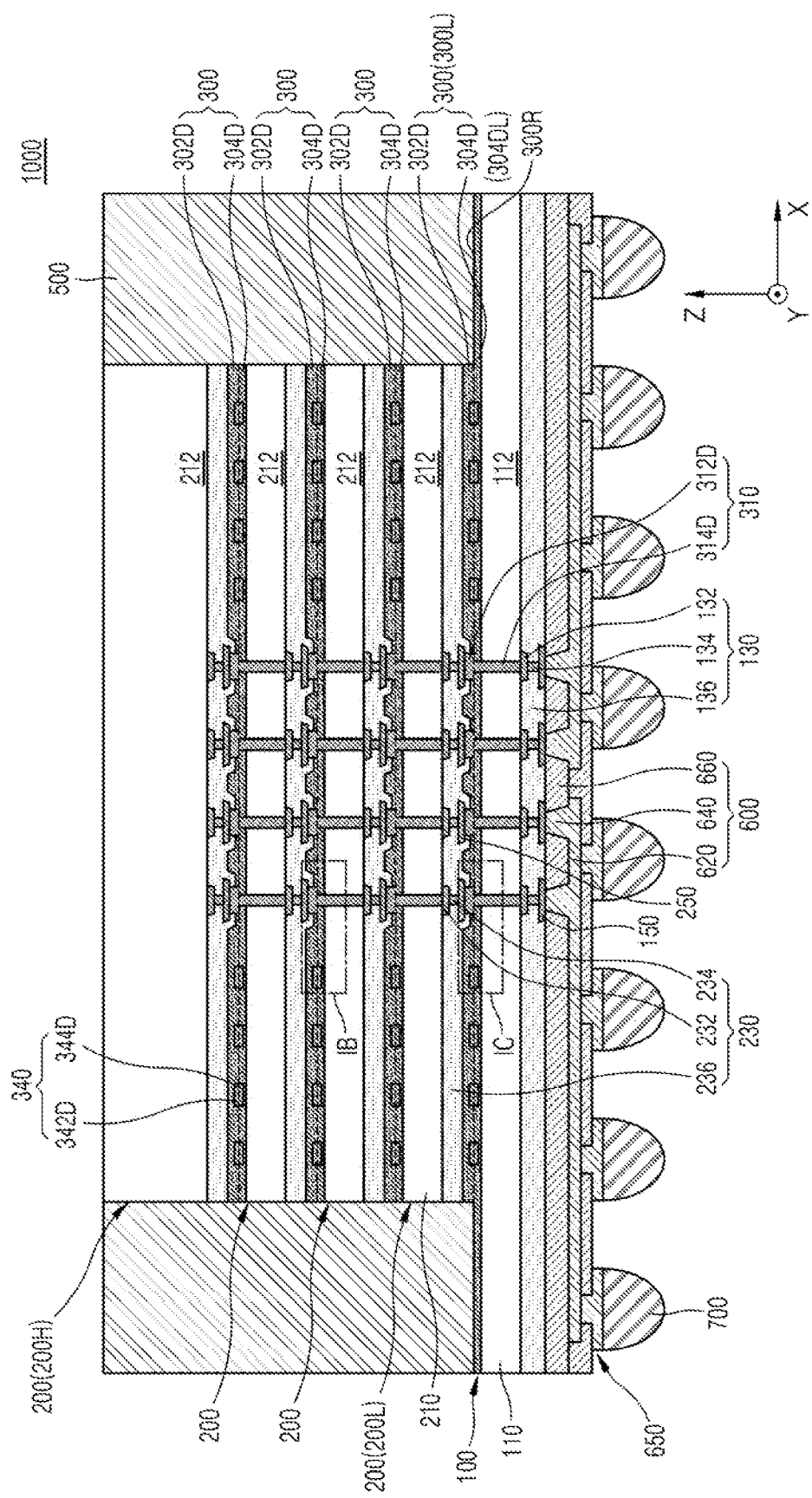
FIG. 1A is a cross-sectional view illustrating a semiconductor package according to an example embodiment.
Figure 1B:
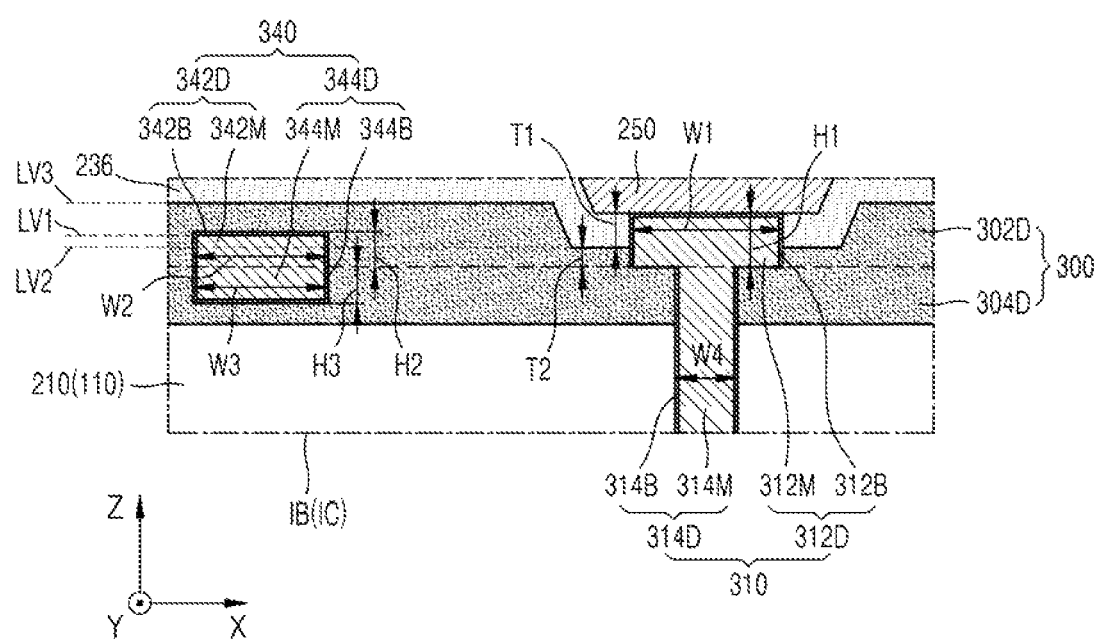
FIG. 1B is a partially enlarged cross-sectional view illustrating a portion of a semiconductor package according to an example embodiment.

FIG. 1A is a cross-sectional view illustrating a semiconductor package 1000 according to an example embodiment, and FIG. 1B is a partially enlarged cross-sectional view illustrating a portion of the semiconductor package 1000 according to an example embodiment.

In detail, FIG. 1B is a cross-sectional view illustrating an enlarged region D3 or region IC of FIG. 1A. The region D3 of FIG. 1A may include a portion of a second semiconductor substrate 210. The region IC of FIG. 1A may include a portion of a first semiconductor substrate 110. Other elements except the portion of the second semiconductor substrate 210 and the portion of the first semiconductor substrate 110 may be substantially the same.

Referring to FIGS. 1A and 1B, the semiconductor package 1000 may include a plurality of semiconductor chips which are sequentially stacked in a vertical direction (a Z direction). For example, the semiconductor package 1000 may include a first semiconductor chip 100 and a plurality of second semiconductor chips 200, which are sequentially stacked in the vertical direction (the Z direction). In FIG. 1A, the semiconductor package 1000 is illustrated as including four second semiconductor chips 200, but the semiconductor package 1000 may include two or more second semiconductor chips 200. The semiconductor package 1000 may include a four-multiple number of second semiconductor chips 200. The plurality of second semiconductor chips 200 may be sequentially stacked on the first semiconductor chip 100. A lowermost one among the plurality of second semiconductor chips 200 may be referred to as a lowermost second semiconductor chip 200L. An uppermost one among the plurality of second semiconductor chips 200 may be referred to as an uppermost second semiconductor chip 200H.

The first semiconductor chip 100 and the plurality of second semiconductor chips 200 in the semiconductor package 1000 may be electrically connected to each other through a plurality of bonding pads 310 to exchange a signal and provide power and ground. For example, the plurality of bonding pads 310 may be disposed between the first semiconductor chip 100 and the lowermost second semiconductor chip 200L and between two adjacent second semiconductor chips 200 of the plurality of second semiconductor chips 200. Each of the plurality of bonding pads 310 may include a pad portion 312D and a through via portion 314D. The through via portion 314D of each of the plurality of bonding pads 310 may extend in the vertical direction (the Z direction) to pass through at least a portion of each of the first semiconductor chip 100 and the plurality of second semiconductor chips 200. In an implementation, the through via portion 314D may not be disposed in the uppermost second semiconductor chip 200H, which is a second semiconductor chip 200 disposed farthest away from the first semiconductor chip 100 and disposed at an uppermost end of the semiconductor package 1000, and may be disposed in only the other second semiconductor chip 200. A via insulation layer may be disposed between the through via portion 314D and a first semiconductor substrate 110 or between the through via portion 314D and a second semiconductor substrate 210.

The plurality of bonding pads 310 may include a material including copper (Cu). A bonding pad 310 disposed between the first semiconductor chip 100 and the lowermost second semiconductor chip 200L may be referred to as a first bonding pad. A bonding pad 310 disposed between two adjacent second semiconductor chips 200 may be referred to as a second bonding pad.

The first semiconductor chip 100 may include the first semiconductor substrate 110 including an active surface and an inactive surface opposite to each other, a first semiconductor device 112 formed on the active surface of the first semiconductor substrate 110, and a first wiring structure layer 130 disposed on the active surface of the first semiconductor substrate 110. The first wiring structure layer 130 may include a plurality of first wiring patterns 132, a plurality of first wiring vias 134, and a first inter-wiring insulation layer 136. At least one first wiring pattern 132 of the plurality of first wiring patterns 132 may be connected to at least one first wiring via 134 of the plurality of first wiring vias 134. The plurality of first wiring patterns 132 may extend in a horizontal direction (an X direction, a Y direction, or an X-Y direction). The plurality of first wiring vias 134 may extend in the vertical direction (the Z direction). Some of the plurality of first wiring patterns 132 and the other first wiring patterns 132 may be disposed at different vertical levels. The plurality of first wiring patterns 132 and the plurality of first wiring vias 134 may each have a multi-layer wiring structure.

The first semiconductor chip 100 may include a plurality of first chip pads 150 that are disposed on a bottom surface thereof, and are electrically connected to the first wiring pattern 132 and/or the first wiring via 134. The plurality of first chip pads 150 may be disposed on the active surface of the first semiconductor substrate 110. The plurality of first chip pads 150 may be electrically connected to a plurality of through via portions 314D passing through the first semiconductor device 112 or at least a portion of the first semiconductor substrate 110 through the first wiring pattern 132 and/or the first wiring via 134.

In the semiconductor package 1000, the first semiconductor chip 100 may be disposed so that the active surface of the first semiconductor substrate 110 faces a lower portion and the inactive surface faces an upper portion. A top surface may denote a surface facing an upper portion. A bottom surface may denote a surface facing a lower portion. A top surface of the first semiconductor chip 100 included in the semiconductor package 1000 may denote a side facing the inactive surface of the first semiconductor substrate 110. A bottom surface of the first semiconductor chip 100 may denote a side facing the active surface of the first semiconductor substrate 110. A surface of the first semiconductor chip 100 facing the active surface of the first semiconductor substrate 110 may be referred to as a front surface of the first semiconductor chip 100. A surface of the first semiconductor chip 100 facing the inactive surface of the first semiconductor substrate 110 may be referred to as a rear surface of the first semiconductor chip 100.

The second semiconductor chip 200 may include the second semiconductor substrate 210 including an active surface and an inactive surface opposite to each other, a second semiconductor device 212 formed on the active surface of the second semiconductor substrate 210, and a second wiring structure layer 230 disposed on the active surface of the second semiconductor substrate 210. The second wiring structure layer 230 may include a plurality of second wiring patterns 232, a plurality of second wiring vias 234, and a second inter-wiring insulation layer 236. At least one second wiring pattern 232 of the plurality of second wiring patterns 232 may be connected to at least one second wiring via 234 of the plurality of second wiring vias 234. The plurality of second wiring patterns 232 may extend in the horizontal direction (the X direction, the Y direction, or the X-Y direction). The plurality of second wiring vias 234 may extend in the vertical direction (the Z direction). Some of the plurality of second wiring patterns 232 and the other second wiring patterns 232 may be disposed at different vertical levels. The plurality of second wiring patterns 232 and the plurality of second wiring vias 234 may each have a multi-layer wiring structure.

The second semiconductor chip 200 may further include a plurality of second chip pads 250 that are disposed on a bottom surface thereof, and are electrically connected to the second wiring pattern 232 and/or the second wiring via 234. The plurality of second chip pads 250 may be disposed on the active surface of the second semiconductor substrate 210. The plurality of second chip pads 250 may be electrically connected to a plurality of through via portions 314D passing through the second semiconductor device 212 or at least a portion of the second semiconductor substrate 210 through the second wiring pattern 232 and/or the second wiring via 234. The second chip pad 250 may have a tapered shape where a horizontal width narrows and extends from an upper portion to a lower portion.

Only the second semiconductor substrate 210 may be exposed at a top surface of the uppermost second semiconductor chip 200H. That is, only a semiconductor material may be disposed on the top surface of the uppermost second semiconductor chip 200H. A vertical height (i.e., a thickness) of the uppermost second semiconductor chip 200H may be greater than a vertical height (i.e., a thickness) of the other second semiconductor chips 200.

In the semiconductor package 1000, each of the plurality of second semiconductor chips 200 may be sequentially stacked in the vertical direction on the first semiconductor chip 100 so that the active surface thereof faces a lower portion (i.e., the first semiconductor chip 100). In FIG. 1A, a top surface of the second semiconductor chip 200 included in the semiconductor package 1000 may denote a side facing the inactive surface of the second semiconductor substrate 210, and a bottom surface of the second semiconductor chip 200 may denote a side facing the active surface of the second semiconductor substrate 210. A surface of the second semiconductor chip 200 facing the active surface of the second semiconductor substrate 210 may be referred to as a front surface of the second semiconductor chip 200. A surface of the second semiconductor chip 200 facing the inactive surface of the second semiconductor substrate 210 may be referred to as a rear surface of the second semiconductor chip 200.

The first semiconductor substrate 110 and the second semiconductor substrate 210 may include, e.g., a semiconductor material such as silicon (Si) or germanium (Ge). Each of the first semiconductor substrate 110 and the second semiconductor substrate 210 may include an active surface, and an inactive surface opposite to the active surface. Each of the first semiconductor substrate 110 and the second semiconductor substrate 210 may include a conductive region (e.g., an impurity-doped well). The first semiconductor substrate 110 and the second semiconductor substrate 210 may each have various isolation structures such as a shallow trench isolation (STI) structure. The active surface and the inactive surface of the first semiconductor substrate 110 may be referred to as a first active surface and a first inactive surface. The active surface and the inactive surface of the second semiconductor substrate 210 may be referred to as a second active surface and a second inactive surface.

Each of the first semiconductor substrate 110 and the second semiconductor substrate 210 may include various kinds of a plurality of individual devices. The plurality of individual devices may include various microelectronic devices, and for example, may include a metal-oxide-semiconductor field effect transistor (MOSFET) such as a complementary metal-oxide-semiconductor (CMOS) transistor, system large scale integration (LSI), an image sensor such as a CMOS imaging sensor (CIS), a micro-electro-mechanical system (MEMS), an active device, and a passive device. The plurality of individual devices may be electrically connected to the conductive region of the first semiconductor substrate 110 or the second semiconductor substrate 210. Each of the first semiconductor substrate 110 and the second semiconductor substrate 210 may further include a conductive wiring or a conductive plug, which electrically connects the conductive region of each of the first semiconductor substrate 110 and the second semiconductor substrate 210 to at least two of the plurality of individual devices or the plurality of individual devices. Each of the plurality of individual devices may be electrically isolated from other adjacent individual devices by an insulation layer.

At least one of the first semiconductor substrate 110 and the second semiconductor substrate 210 may include a memory semiconductor chip. The first semiconductor chip 100 may include a serial-parallel conversion circuit, and may be a buffer chip for controlling the plurality of second semiconductor chips 200. The plurality of second semiconductor chips 200 may be memory chips including memory cells. For example, the semiconductor package 1000 including the first semiconductor chip 100 and the plurality of second semiconductor chips 200 may include a high bandwidth memory (HBM), the first semiconductor chip 100 may be referred to as an HBM controller die, and each of the plurality of second semiconductor chips 200 may be referred to as a DRAM die.

The plurality of first wiring patterns 132, the plurality of first wiring vias 134, the plurality of first chip pads 150, the plurality of second wiring patterns 232, the plurality of second wiring vias 234, and the plurality of second chip pads 250 may include, e.g., a metal material such as aluminum, copper, or tungsten. The plurality of first wiring patterns 132, the plurality of first wiring vias 134, the plurality of first chip pads 150, the plurality of second wiring patterns 232, the plurality of second wiring vias 234, and the plurality of second chip pads 250 may include a wiring barrier layer and a wiring metal layer. The wiring barrier layer may include metal, metal nitride, or an alloy. The wiring metal layer may include tungsten (W), aluminum (Al), titanium (Ti), tantalum (Ta), ruthenium (Ru), manganese (Mn), or copper (Cu).

When the plurality of first wiring patterns 132 and the plurality of first wiring vias 134 have a multi-layer wiring structure and the plurality of second wiring patterns 232 and the plurality of second wiring vias 234 have a multi-layer wiring structure, the first inter-wiring insulation layer 136 and the second inter-wiring insulation layer 236 may have a multi-layer structure where a plurality of insulation layers are stacked, on the basis of a multi-layer wiring structure. For example, the first inter-wiring insulation layer 136 and the second inter-wiring insulation layer 236 may include silicon oxide, silicon nitride, silicon oxynitride, an insulating material which is lower in dielectric constant than silicon oxide, or a combination thereof. The first inter-wiring insulation layer 136 and the second inter-wiring insulation layer 236 may each include a tetraethyl orthosilicate (TEOS) layer or an ultra low K (ULK) layer having an ultra low dielectric constant K of about 2.2 to about 2.4. The ULK layer may include a SiOC layer or a SiCOH layer.

The first inter-wiring insulation layer 136 may include the plurality of first wiring patterns 132, the plurality of first wiring vias 134, and the plurality of first chip pads 150. The second inter-wiring insulation layer 236 may include the plurality of second wiring patterns 232, the plurality of second wiring vias 234, and the plurality of second chip pads 250.

Each of the plurality of bonding pads 310 may be formed by a process where a conductive material layer is separately formed on each of surfaces facing each other of two adjacent chips of the plurality of second semiconductor chips 200 and the first semiconductor chip 100, and then, conductive material layers facing each other are diffusion-bonded to form one body through diffusion of metal atoms contacting each other on the basis of expansion by heat. For example, as illustrated in FIGS. 4A to 7B, each of the plurality of bonding pads 310 may be formed by a process where a front pad 312 illustrated in FIG. 2C and a through via 314 illustrated in FIG. 3I are diffusion-bonded to form one body through diffusion of metal atoms contacting each other on the basis of expansion by heat. The pad portion 312D and the through via portion 314D of each of the plurality of bonding pads 310 may be a portion corresponding to the front pad 312 of FIG. 2C and the through via 314 of FIG. 3I.

The pad portion 312D of the plurality of bonding pads 310 may be disposed on the plurality of second chip pads 250. The through via portion 314D may be disposed to pass through the first semiconductor substrate 110 or the second semiconductor substrate 210.

A bonding insulation material layer 300, surrounding the plurality of bonding pads 310, may be disposed between the first semiconductor chip 100 and the lowermost second semiconductor chip 200L and between two adjacent second semiconductor chips 200. The bonding insulation material layer 300 may be formed by a process where an insulation material layer is separately formed on each of surfaces facing each other of two adjacent chips of the plurality of second semiconductor chips 200 and the first semiconductor chip 100, and then, insulation material layers facing each other are bonded to form one body through covalent bonds. For example, as illustrated in FIGS. 4A to 7B, the bonding insulation material layer 300 may be formed by a process where a front insulation material layer 302 illustrated in FIG. 2C and a rear insulation material layer 304 illustrated in FIG. 3I face and contact each other through expansion by heat, and are bonded to form one body through a covalent bond.

The bonding insulation material layer 300 may include a front insulation material portion 302D and a rear insulation material portion 304D. The front insulation material portion 302D and the rear insulation material portion 304D may include SiO, SiN, SiCN, SiCO, or a polymer material. The polymer material may include benzocyclobutene (BCB), polyimide (PI), polybenzoxazole (PBO), silicone, acrylate, or epoxy. The front insulation material portion 302D and the rear insulation material portion 304D may include silicon oxide such as TEOS. The front insulation material portion 302D may be a portion, surrounding the pad portion 312D, of the bonding insulation material layer 300. The rear insulation material portion 304D may be a portion, surrounding the through via portion 314D, of the bonding insulation material layer 300. The front insulation material portion 302D and the rear insulation material portion 304D of the bonding insulation material layer 300 may be portions respectively corresponding to the front insulation material layer 302 illustrated in FIG. 2C and the rear insulation material layer 304 illustrated in FIG. 3I.

The front insulation material portion 302D may cover the second inter-wiring insulation layer 236. A portion of the second inter-wiring insulation layer 236 may include high density plasma (HDP) oxide. For example, a portion, corresponding to a front surface of the second semiconductor chip 200, of the second inter-wiring insulation layer 236 (i.e., a portion of a lower portion of the second inter-wiring insulation layer 236) may include HDP oxide. The front insulation material portion 302D may cover a lower portion of the second inter-wiring insulation layer 236 including HDP oxide.

A lower surface of the second inter-wiring insulation layer 236 may have a step that protrudes to a lower portion on the basis of the second chip pad 250. An upper surface of the second chip pad 250 may be covered by the second inter-wiring insulation layer 236, and a lower surface thereof may be covered by the front insulation material portion 302D. The rear insulation material portion 304D may cover the inactive surface of the first semiconductor substrate 110 or the inactive surface of the second semiconductor substrate 210. Each of a plurality of bonding insulation material layers 300 may include a flat bottom surface and a top surface including a concave portion corresponding to the second chip pad 250.

The rear insulation material portion 304D may surround the through via portion 314D. An upper side surface of the through via portion 314D may be covered by the rear insulation material portion 304D, and a lower side surface thereof may be covered by the first semiconductor substrate 110 or the second semiconductor substrate 210.

A bonding insulation material layer 300 that is disposed between the first semiconductor chip 100 and the lowermost second semiconductor chip 200L may be referred to as a lowermost bonding insulation material layer 300L. A rear insulation material portion 304D that covers the inactive surface of the first semiconductor substrate 110 may be referred to as a lowermost rear insulation material portion 304DL.

The semiconductor package 1000 may include a plurality of bonding thermal pads 340 that are surrounded by the bonding insulation material layer 300 and are spaced apart from the plurality of bonding pads 310 in the horizontal direction. A top surface, a bottom surface, and a side surface of each of the plurality of bonding pads 310 may be fully covered by the bonding insulation material layer 300. The plurality of bonding pads 310 may be spaced apart from, and may not contact, the first semiconductor substrate 110 or the second semiconductor substrate 210 with the bonding insulation material layer 300 therebetween, or may be spaced apart from, and may not contact, the second inter-wiring insulation layer 236. A thickness of each bonding thermal pad 340 may be less than a thickness of the pad portion 312D.

A portion, surrounding the bonding thermal pad 340, of each of the plurality of bonding insulation material layers 300 may be thicker than a portion, surrounding the bonding pad 310, of each of the plurality of bonding insulation material layers 300. A top surface and an upper side surface of the bonding thermal pad 340 may be covered by the front insulation material portion 302D. A bottom surface and a lower side surface of the bonding thermal pad 340 may be covered by the rear insulation material portion 304D. The bonding thermal pad 340 may include a front thermal pad portion 342D and a rear thermal pad portion 344D. The front thermal pad portion 342D may be a portion, surrounded by the front insulation material portion 302D, of the bonding thermal pad 340. The rear thermal pad portion 344D may be a portion, surrounded by the rear insulation material portion 304D, of the bonding thermal pad 340. The front thermal pad portion 342D and the rear thermal pad portion 344D of the bonding thermal pad 340 may be portions respectively corresponding to the front thermal pad layer 342 illustrated in FIG. 2C and the rear thermal pad layer 344 illustrated in FIG. 3I.

The plurality of bonding pads 310 may fully pass through the bonding insulation material layer 300, and may be buried into the bonding insulation material layer 300 without passing through the bonding insulation material layer 300. A top surface of each of the plurality of bonding pads 310 may be disposed at a vertical level that is higher than a top surface of each of the plurality of bonding thermal pads 340. The top surface of each of the plurality of bonding thermal pads 340 may be disposed at a first vertical level LV1. An interface between the second inter-wiring insulation layer 236 and the front insulation material layer 302 may have a lowest vertical level that is adjacent to the plurality of bonding pads 310 and is disposed at a second vertical level LV2, or may have a highest vertical level that is disposed at a third vertical level LV3 as the interface is farther away from the plurality of bonding pads 310 and is progressively raised. The first vertical level LV1 may be disposed at a vertical level that is higher than the second vertical level LV2 and lower than the third vertical level LV3.

The pad portion 312D may include a pad barrier layer 312B and a pad conductive layer 312M. The through via portion 314D may include a through barrier layer 314B and a through plug layer 314M. The front thermal pad portion 342D may include a front thermal barrier layer 342B and a front thermal conductive layer 342M. The rear thermal pad portion 344D may include a rear thermal barrier layer 344B and a rear thermal conductive layer 344M. The pad barrier layer 312B may cover a top surface and a side surface of the pad conductive layer 312M. The through barrier layer 314B may cover a side surface of the through plug layer 314M. The front thermal barrier layer 342B may cover a top surface and a side surface of the front thermal conductive layer 342M. The rear thermal barrier layer 344B may cover a bottom surface and a side surface of the rear thermal conductive layer 344M. The pad barrier layer 312B may not cover a bottom surface of the pad conductive layer 312M. A portion of the bottom surface of the pad conductive layer 312M may not be covered by the rear insulation material portion 304D. The other portion of the bottom surface of the pad conductive layer 312M may be connected to the through via portion 314D.

The through plug layer 314M may have a circular pillar shape. The through barrier layer 314B may have a cylindrical shape that surrounds a sidewall of the through plug layer 314M.

With respect to a bottom of the pad portion 312D contacting the bonding insulation material layer 300 (e.g., a bottom surface of the pad conductive layer 312M contacting the rear insulation material portion 304D), upper portions of the bonding insulation material layer 300, the bonding pad 310, and the bonding thermal pad 340 may respectively be the front insulation material portion 302D, the pad portion 312D, and the front thermal pad portion 342D, and lower portions of the bonding insulation material layer 300, the bonding pad 310, and the bonding thermal pad 340 may respectively be the rear insulation material portion 304D, the through via portion 314D, and the rear thermal pad portion 344D.

On the second chip pad 250, a portion of the second inter-wiring insulation layer 236 covering the second chip pad 250 may have a first thickness T1, and a portion of the front insulation material portion 302D may have a second thickness T2. The first thickness T1 may be greater than the second thickness T2. For example, the first thickness T1 may be about 1.5 μm to about 3 μm, and the second thickness T2 may be about 0.5 μm to about 1.2 μm.

The pad portion 312D may have a first vertical height H1 and a first horizontal width W1. The front thermal pad portion 342D may have a second vertical height H2 and a second horizontal width W2. The rear thermal pad portion 344D may have a third vertical height H3 and a third horizontal width W3. The through via portion 314D may have a fourth horizontal width W4.

The first vertical height H1 may have the same value as a sum of the first thickness T1 and the second thickness T2. For example, the first vertical height H1 may be about 2.1 µm to about 4.5 µm. The first vertical height H1 may have a value that is greater than a sum of the second vertical height H2 and the third vertical height H3. The first horizontal width W1 may be greater than the fourth horizontal width W4. The first horizontal width W1 may have a value that is two or more times the fourth horizontal width W4, e.g., the fourth horizontal width W4 may have a value that is ½ or less of the first horizontal width W1. For example, the first horizontal width W1 may be about 6 µm to about 12 µm, and the fourth horizontal width W4 may be about 2 µm to about 6 µm.

The second vertical height H2 may be less than the first vertical height H1. The second vertical height H2 may be greater than the second thickness T2. For example, the second vertical height H2 may be about 0.7 µm to about 1.5 µm. Each of the second horizontal width W2 and the third horizontal width W3 may be less than the first horizontal width W1. The second horizontal width W2 may be about 0.5 to about 1.5 times the fourth horizontal width W4. In FIG. 1B, it is illustrated that the second horizontal width W2 is greater than the fourth horizontal width W4, for example.

The third vertical height H3 and the third horizontal width W3 may have substantially the same value as those of the second vertical height H2 and the second horizontal width W2, for example. The third vertical height H3 and the third horizontal width W3 may have a value that is slightly less than those of the second vertical height H2 and the second horizontal width W2, or may have a value that is slightly greater than those of the second vertical height H2 and the second horizontal width W2.

The pad conductive layer 312M, the through plug layer 314M, the front thermal conductive layer 342M, and the rear thermal conductive layer 344M may include a material including copper (Cu). The pad barrier layer 312B, the through barrier layer 314B, the front thermal barrier layer 342B, and the rear thermal barrier layer 344B may include Ti, Ta, TiN, or TaN.

The lowermost bonding insulation material layer 300L may include a recess 300R at a portion of an upper portion thereof so that a thickness of a portion, overlapping the lowermost second semiconductor chip 200L in the vertical direction, of the lowermost bonding insulation material layer 300L has is greater than a thickness of a portion, which does not overlap the lowermost second semiconductor chip 200L in the vertical direction, of the lowermost bonding insulation material layer 300L. The recess 300R may be disposed at a portion, which does not overlap the lowermost second semiconductor chip 200L in the vertical direction, of the lowermost bonding insulation material layer 300L. The lowermost bonding insulation material layer 300L may include a flat bottom surface, and may have a shape where a center portion (i.e., a portion overlapping the lowermost second semiconductor chip 200L in the vertical direction) of the lowermost bonding insulation material layer 300L protrudes more upward than an edge portion (i.e., a portion which does not overlap the lowermost second semiconductor chip 200L in the vertical direction) of the lowermost bonding insulation material layer 300L.

The lowermost bonding insulation material layer 300L may cover all of a portion, which does not overlap the lowermost second semiconductor chip 200L in the vertical direction, of the top surface of the first semiconductor chip 100. The lowermost bonding insulation material layer 300L may cover the top surface of the first semiconductor chip 100 and a bottom surface of the lowermost second semiconductor chip 200L. The other bonding insulation material layer 300, except the lowermost bonding insulation material layer 300L, may cover the top surface and the bottom surface of the second semiconductor chip 200 facing each other along with the plurality of bonding pads 310.

The front insulation material portion 302D of each of the plurality of bonding insulation material layers 300, disposed between the first semiconductor chip 100 and the lowermost second semiconductor chip 200L and between two adjacent second semiconductor chips 200 of the plurality of second semiconductor chips 200, may have substantially the same horizontal width. The rear insulation material portion 304D of each of the plurality of bonding insulation material layers 300, disposed between two adjacent second semiconductor chips 200 of the plurality of second semiconductor chips 200, may have substantially the same horizontal width. A horizontal width of the lowermost rear insulation material portion 304DL of the lowermost bonding insulation material layer 300L disposed between the first semiconductor chip 100 and the lowermost second semiconductor chip 200L may be greater than a horizontal width of the other rear insulation material portion 304D. A horizontal width of the other rear insulation material portion 304D, except the lowermost rear insulation material portion 304DL, may be substantially the same as a horizontal width of the front insulation material portion 302D of each of the plurality of bonding insulation material layers 300.

The semiconductor package 1000 may include a package molding layer 500 that covers the top surface of the first semiconductor chip 100 and surrounds the side surface of each of the plurality of second semiconductor chips 200, on the first semiconductor chip 100. The package molding layer 500 may include, e.g., an epoxy molding compound (EMC). The package molding layer 500 may cover a top surface of the uppermost second semiconductor chip 200H, or the package molding layer 500 may not cover the top surface of the uppermost second semiconductor chip 200H. A heat dissipation member may be attached on the uppermost second semiconductor chip 200H with a thermal interface material layer (TIM) therebetween.

The semiconductor package 1000 may include a base redistribution layer 600 disposed on the bottom surface of the first semiconductor chip 100. The base redistribution layer 600 may include a plurality of package redistribution line patterns 620, a plurality of package redistribution vias 640, and a package redistribution insulation layer 660. A plurality of package redistribution insulation layers 660 may be stacked. The package redistribution insulation layer 660 may be formed from, e.g., a photo imagable dielectric (PID) or a photosensitive polyimide (PSPI). The package redistribution line pattern 620 and the package redistribution via 640 may include, e.g., metal such as copper (Cu), aluminum (Al), tungsten (W), titanium (Ti), tantalum (Ta), indium (In), manganese (Mn), cobalt (Co), zinc (Sn), nickel (Ni), magnesium (Mg), rhenium (Re), beryllium (Be), gallium (Ga), or ruthenium (Ru), or an alloy thereof. The package redistribution line pattern 620 and the package redistribution via 640 may be formed by stacking metal or an alloy of metals on a seed layer including titanium, titanium nitride, or tantalum tungsten.

The plurality of package redistribution line patterns 620 may be disposed on at least one surface of a top surface and a bottom surface of the package redistribution insulation layer 660. The plurality of package redistribution vias 640 may pass through the package redistribution insulation layer 660, and may contact and may be connected to partial portions of the plurality of package redistribution line patterns 620, respectively. At least some of the plurality of package redistribution line patterns 620 may be formed as one body along with some of the plurality of package redistribution vias 640. For example, the package redistribution line pattern 620 and the package redistribution via 640 contacting a top surface of the package redistribution line pattern 620 may configure one body. The package redistribution insulation layer 660 may surround the plurality of package redistribution line patterns 620 and the plurality of package redistribution vias 640.

The plurality of package redistribution line patterns 620 and the plurality of package redistribution vias 640 may be electrically connected to the plurality of first chip pads 150. At least some of the plurality of package redistribution vias 640 may contact the plurality of first chip pads 150. For example, when the base redistribution layer 600 includes a plurality of package redistribution insulation layers 660 which are stacked, the package redistribution via 640 passing through the uppermost package redistribution insulation layer 660 may contact and may be electrically connected to the first chip pad 150.

The plurality of package redistribution vias 640 may have a tapered shape in which a horizontal width narrows from a lower portion to an upper portion and extends. For example, the plurality of package redistribution vias 640 may have a horizontal width that becomes wider as the plurality of package redistribution vias 640 are farther away from the first semiconductor chip 100.

A package redistribution line pattern 620, disposed on a bottom surface of the base redistribution layer 600, of the plurality of package redistribution line patterns 620 may be referred to as a package pad 650. A plurality of package connection terminals 700 may be attached on the plurality of package pads 650. For example, each of the plurality of package connection terminals 700 may include a solder ball or a bump.

The semiconductor package 1000 may not include the base redistribution layer 600, and the plurality of package connection terminals 700 may be attached on the plurality of first chip pads 150.

A horizontal width and a horizontal area of the base redistribution layer 600 may be the same as a horizontal width and a horizontal area of the first semiconductor chip 100, respectively. The base redistribution layer 600 and the first semiconductor chip 100 may overlap each other in the vertical direction.

Horizontal widths and horizontal areas of the base redistribution layer 600, the first semiconductor chip 100, and the package molding layer 500 may be substantially the same. A side surface of each of the base redistribution layer 600, the first semiconductor chip 100, and the package molding layer 500 may be aligned in the vertical direction to form a coplanar surface.

In the semiconductor package 1000, the plurality of bonding pads 310 may include the pad portion 312D and the through via portion 314D provided as one body, and thus, the bonding insulation material layer 300 may be relatively thinly formed. In detail, a separate element (e.g., an element similar to the front pad 312) that is to be bonded to the front pad 312 of FIG. 2C on the through via 314 of FIG. 3I may not be provided, and thus, a thickness of the bonding insulation material layer 300 may decrease by a thickness of the separate element which is to be bonded to the front pad 312. Because an element that corresponds to the front pad 312 and is similar to the front pad 312 is not provided, a thickness of the bonding insulation material layer 300 may decrease by about thickness of the front pad 312 (e.g., about 2.1 µm to about 4.5 µm which is the first vertical height H1). When a thickness of the bonding insulation material layer 300 decreases by about first vertical height H1, a thermal resistance caused by the bonding insulation material layer 300 may decrease by about 2% to about 5%. Therefore, a thermal resistance between the first semiconductor chip 100 and the lowermost second semiconductor chip 200L and between two adjacent second semiconductor chips 200 of the plurality of second semiconductor chips 200 may decrease. Thus, heat dissipation performance may be enhanced where heat occurring in the first semiconductor chip 100 and the plurality of second semiconductor chips 200 is dissipated to the outside of the semiconductor package 1000.

Also, heat dissipation performance of dissipating heat to the outside of the semiconductor package 1000 by using the plurality of bonding thermal pads 340 included in the semiconductor package may be enhanced. For example, as a thickness of the bonding insulation material layer 300 decreases and the plurality of bonding thermal pads 340 are provided, a thermal resistance between the first semiconductor chip 100 and the lowermost second semiconductor chip 200L and between two adjacent second semiconductor chips 200 of the plurality of second semiconductor chips 200 may decrease by about 10% or more, and the heat dissipation performance of the semiconductor package 1000 may be enhanced by a reduction in a thermal resistance.

FIGS. 2A to 2C and 3A to 3I are partially enlarged cross-sectional views illustrating a method of manufacturing a semiconductor chip included in a semiconductor package, according to an example embodiment.

Figure 2A:
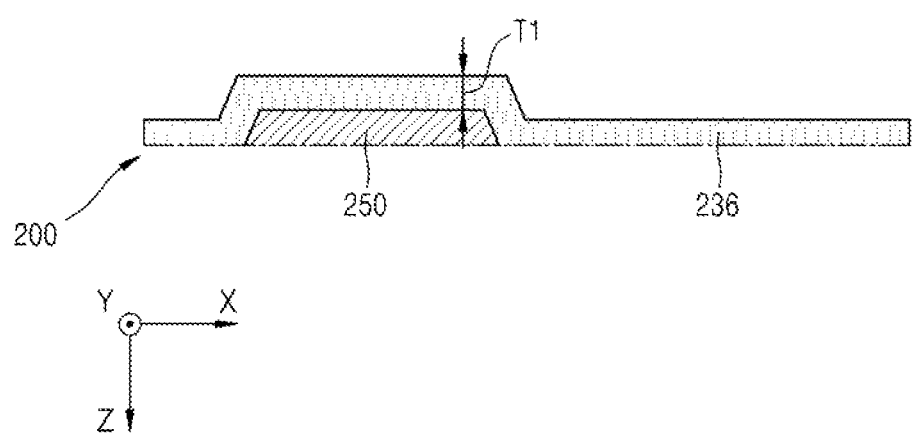
FIGS. 2A to 2C and 3A to 3I are partially enlarged cross-sectional views illustrating a method of manufacturing a semiconductor chip included in a semiconductor package, according to an example embodiment.
Figure 2B:
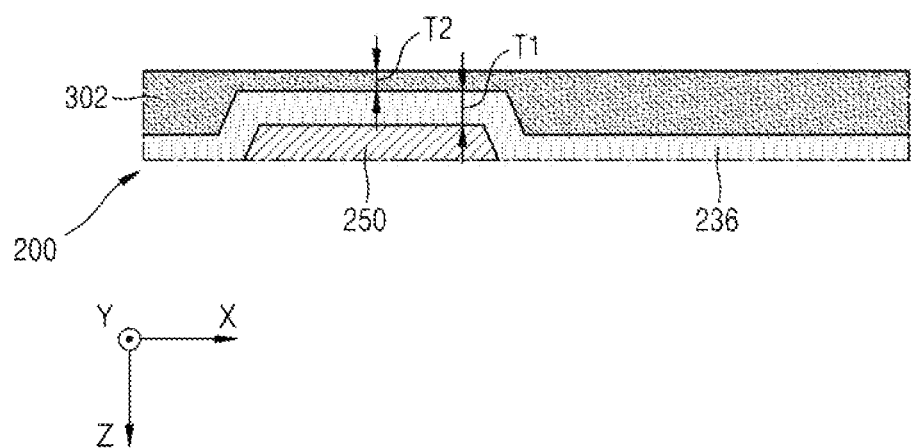
Figure 2C:
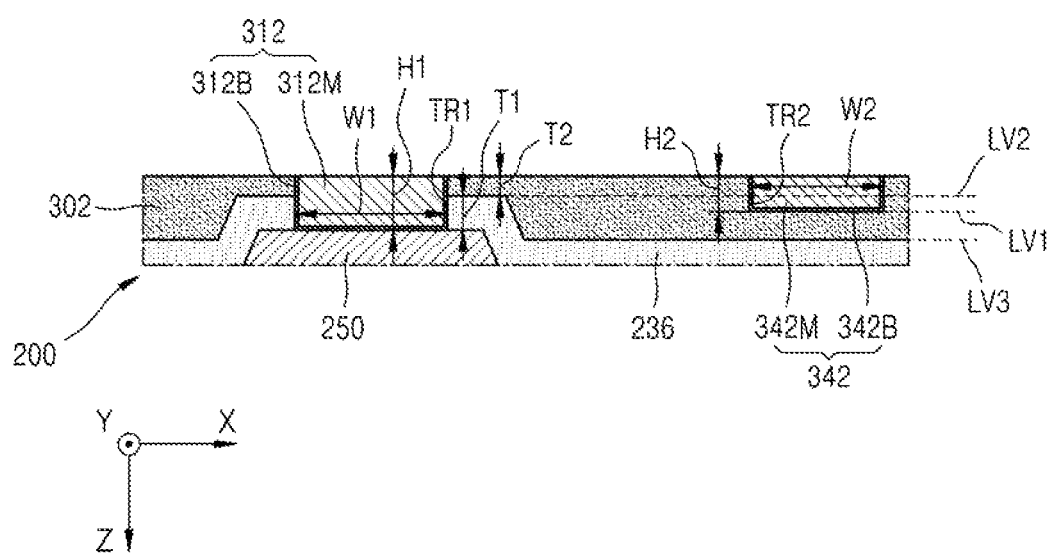

In detail, FIGS. 2A to 2C are partially enlarged cross-sectional views illustrating a portion corresponding to a portion of a front surface of a second semiconductor chip included in a semiconductor package, and are cross-sectional views illustrating a vertically reversed portion corresponding to a portion of a lower portion of a second semiconductor chip 200 illustrated in a region D3 or a region IC of FIG. 1A. FIGS. 3A to 3I are partially enlarged cross-sectional views illustrating a portion corresponding to a portion of a rear surface of a first semiconductor chip or a second semiconductor chip included in a semiconductor package, and are cross-sectional views illustrating a portion corresponding to a portion of a front surface of a first semiconductor chip 100 or the second semiconductor chip 200 illustrated in the region D3 or the region IC of FIG. 1A.

Referring to FIG. 2A, a second semiconductor chip 200 may be prepared in which a second inter-wiring insulation layer 236 surrounds a second chip pad 250 and covers a top surface of the second chip pad 250. In FIGS. 2A to 2C, it is illustrated that a front surface of the second semiconductor chip 200 faces an upper portion.

The second chip pad 250 may be formed to have a tapered shape where a horizontal width narrows and extends from a lower portion to an upper portion.

The second inter-wiring insulation layer 236 may be formed to have a first thickness T1 on the top surface of the second chip pad 250. An upper surface of the second inter-wiring insulation layer 236 may have a step which protrudes to an upper portion on the basis of the second chip pad 250. A portion of an upper portion of the second inter-wiring insulation layer 236 including a portion covering the top surface of the second chip pad 250 may include HDP oxide.

Referring to FIG. 2B, a front insulation material layer 302 covering a second inter-wiring insulation layer 236 may be formed on the second semiconductor chip 200. In FIG. 2B, the front insulation material layer 302 is illustrated as including a flat top surface, but the top surface of the front insulation material layer 302 may protrude slightly upward on the basis of an upper surface of the second inter-wiring insulation layer 236 including a step which protrudes upward. The front insulation material layer 302 may include silicon oxide such as TEOS. The front insulation material layer 302 may be formed to have a second thickness T2 that is less than the first thickness T1, on the second chip pad 250.

Referring to FIG. 2C, a first trench TR1, including a bottom surface at which a top surface of the second chip pad 250 is exposed, may be formed by removing a portion of the front insulation material layer 302 and a portion of the second inter-wiring insulation layer 236. Then, the pad barrier layer 312B, covering the bottom surface and an inner sidewall of the first trench TR1, and the pad conductive layer 312M, covering the pad barrier layer 312B and filling the first trench TR1, may be formed, thereby forming the front pad 312.

In a portion apart from the second chip pad 250, a second trench TR2, including a bottom surface at which a portion of the front insulation material layer 302 is exposed, may be formed by removing another portion of the front insulation material layer 302 so as not to expose the second inter-wiring insulation layer 236. Then, the front thermal barrier layer 342B, covering the bottom surface and an inner sidewall of the second trench TR2, and the front thermal conductive layer 342M, covering the front thermal barrier layer 342B and filling the second trench TR2, may be formed, thereby forming the front thermal pad layer 342.

After each of the first trench TR1 and the second trench TR2 is formed, the pad barrier layer 312B and the front thermal barrier layer 342B may be formed together, and the pad conductive layer 312M and the front thermal conductive layer 342M may be formed together. For example, a preliminary front barrier layer conformally covering the bottom surface and the inner sidewall of each of the first trench TR1 and the second trench TR2 and a top surface of the front insulation material layer 302, and a preliminary front conductive layer covering the preliminary front barrier layer and filling the first trench TR1 and the second trench TR2 may be sequentially formed. Then, the pad barrier layer 312B, the pad conductive layer 312M, the front thermal barrier layer 342B, and the front thermal conductive layer 342M may be formed by removing a portion of an upper portion of the preliminary front barrier layer and a portion of an upper portion of the preliminary front conductive layer until the front insulation material layer 302 is exposed. The preliminary front barrier layer may be formed to include Ti, Ta, TiN, or TaN. The preliminary front conductive layer may be formed to include Cu.

A top surface of each of the front insulation material layer 302, the pad barrier layer 312B, the pad conductive layer 312M, the front thermal barrier layer 342B, and the front thermal conductive layer 342M may be formed to configure a coplanar surface. A bottom surface of the front thermal pad layer 342 (i.e., a bottom surface of the second trench TR2) may be formed to be disposed at a first vertical level LV1, and an interface between the second inter-wiring insulation layer 236 and the bonding insulation material layer 300 may be formed to have a highest vertical level, which is adjacent to the plurality of bonding pads 310 and is disposed at a second vertical level LV2, and a lowest vertical level, which is progressively lowered to be farther away from the plurality of bonding pads 310 and is disposed at a third vertical level LV3. The first vertical level LV1 may be disposed at a vertical level that is lower than the second vertical level LV2 and higher than the third vertical level LV3.

The front pad 312 may be formed to have a first vertical height H1 and a first horizontal width W1. The front thermal pad layer 342 may be formed to have a second vertical height H2 and a second horizontal width W2.

The first vertical height H1 may have the same value as a sum of the first thickness T1 and the second thickness T2. For example, the first vertical height H1 may be about 2.1 μm to about 4.5 μm. For example, the first horizontal width W1 may be about 6 μm to about 12 μm, and the second vertical height H2 may be less than the first vertical height H1. The second vertical height H2 may be greater than the second thickness T2. For example, the second vertical height H2 may be about 0.7 μm to about 1.5 μm.

Figure 3A:
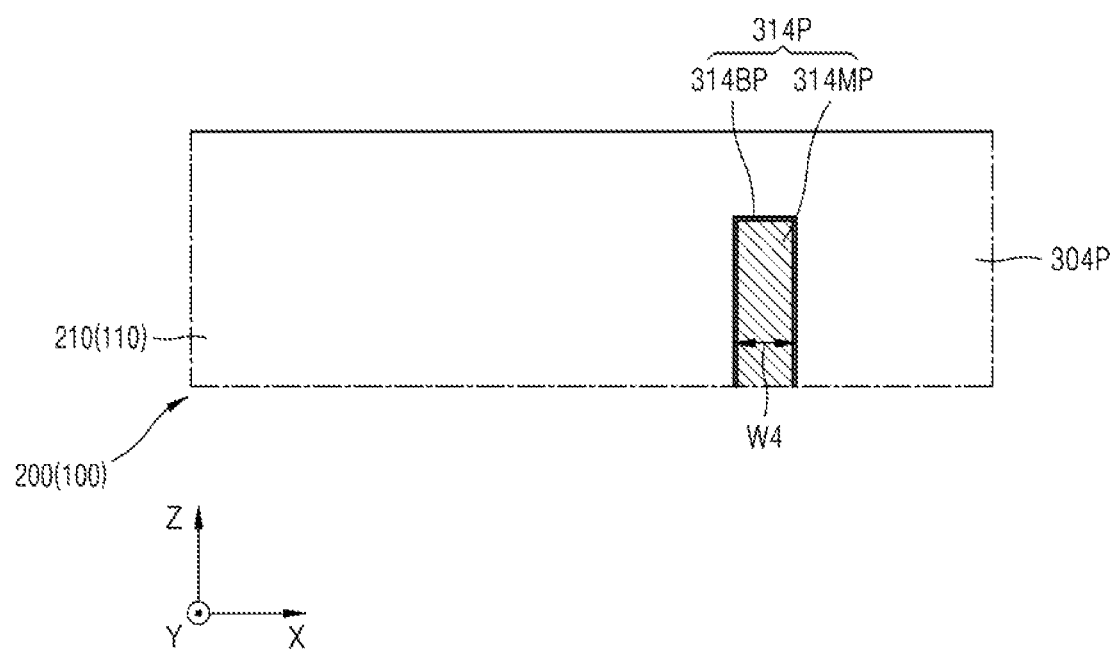

Referring to FIG. 3A, a second semiconductor chip 200, including a preliminary through via 314P passing through a portion of a second semiconductor substrate 210 or a first semiconductor chip 100 including the preliminary through via 314P passing through a portion of a first semiconductor substrate 110, may be prepared. The preliminary through via 314P may be formed to have a fourth horizontal width W4. In FIGS. 3A to 3I, it is illustrated that a rear surface of the second semiconductor chip 200 or the first semiconductor chip 100 faces an upper portion.

In FIGS. 3A to 3I, the second semiconductor chip 200 including the second semiconductor substrate 210 will be described below and the description may be identically applied to the first semiconductor chip 100 including the first semiconductor substrate 110 instead of the second semiconductor chip 200 including the second semiconductor substrate 210, and thus, repeated descriptions are omitted.

The preliminary through via 314P may be formed to pass through a portion of the second semiconductor substrate 210 and not to extend a top surface (i.e., an inactive surface) of the second semiconductor substrate 210. That is, the preliminary through via 314P may not be exposed at the inactive surface of the second semiconductor substrate 210. The preliminary through via 314P may include a preliminary through plug layer 314MB and a preliminary through barrier layer 314BP disposed between the second semiconductor substrate 210 and the preliminary through plug layer 314MB. A via insulation layer may be disposed between the preliminary through via 314P and the second semiconductor substrate 210.

Figure 3B:
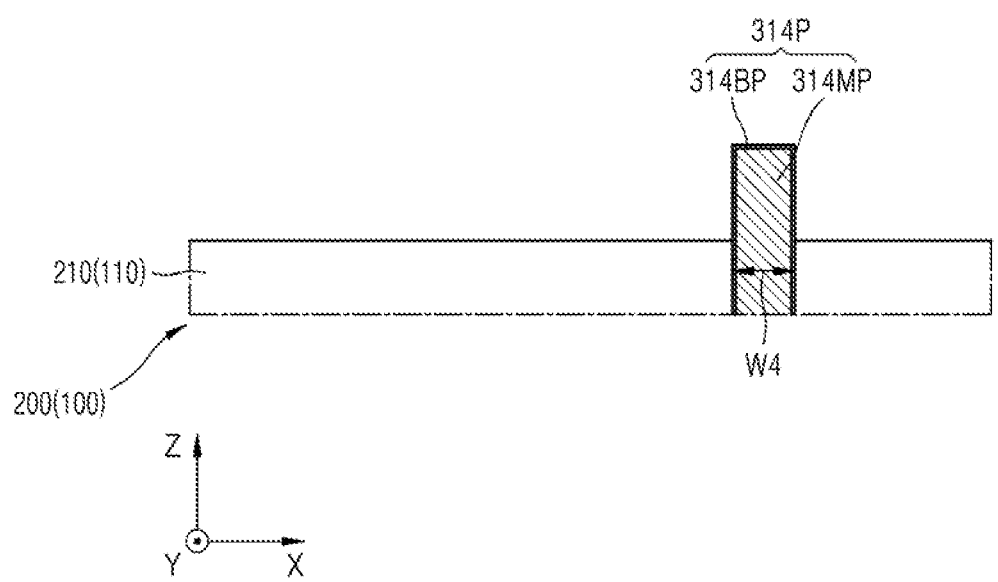

Referring to FIG. 3B, by removing a portion of an upper portion of the second semiconductor substrate 210, a portion of an upper portion of the preliminary through via 314P may be formed to protrude from a top surface of the second semiconductor substrate 210.

Figure 3C:
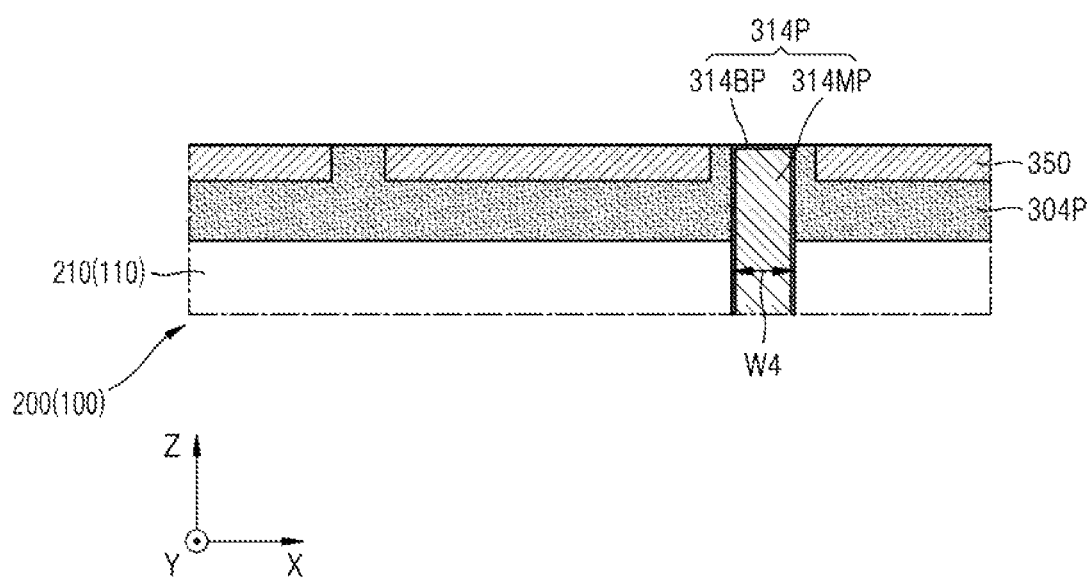

Referring to FIG. 3C, a preliminary rear insulation material layer 304P, covering the top surface (i.e., an inactive surface) of the second semiconductor substrate 210 and a sidewall of a portion of the upper portion of the preliminary through via 314P protruding from the top surface of the second semiconductor substrate 210, may be formed. An align key pattern 350, spaced apart from the preliminary through via 314P, may be formed on the preliminary rear insulation material layer 304P. A top surface of the preliminary through via 314P, a top surface of the preliminary rear insulation material layer 304P, and a top surface of the align key pattern 350 may be formed to configure a coplanar surface.

In FIG. 3C, it is illustrated that the preliminary through barrier layer 314BP covers a top surface of the preliminary through plug layer 314MB, but, in a process of forming the top surface of the preliminary through via 314P, the top surface of the preliminary rear insulation material layer 304P, and the top surface of the align key pattern 350 to configure a coplanar surface, a portion of an upper portion of the preliminary through via 314P may be removed. Thus, a portion of the preliminary through barrier layer 314BP covering the top surface of the preliminary through plug layer 314MB may be removed.

The preliminary rear insulation material layer 304P may include silicon oxide such as TEOS. The align key pattern 350 may include silicon oxide.

Figure 3D:
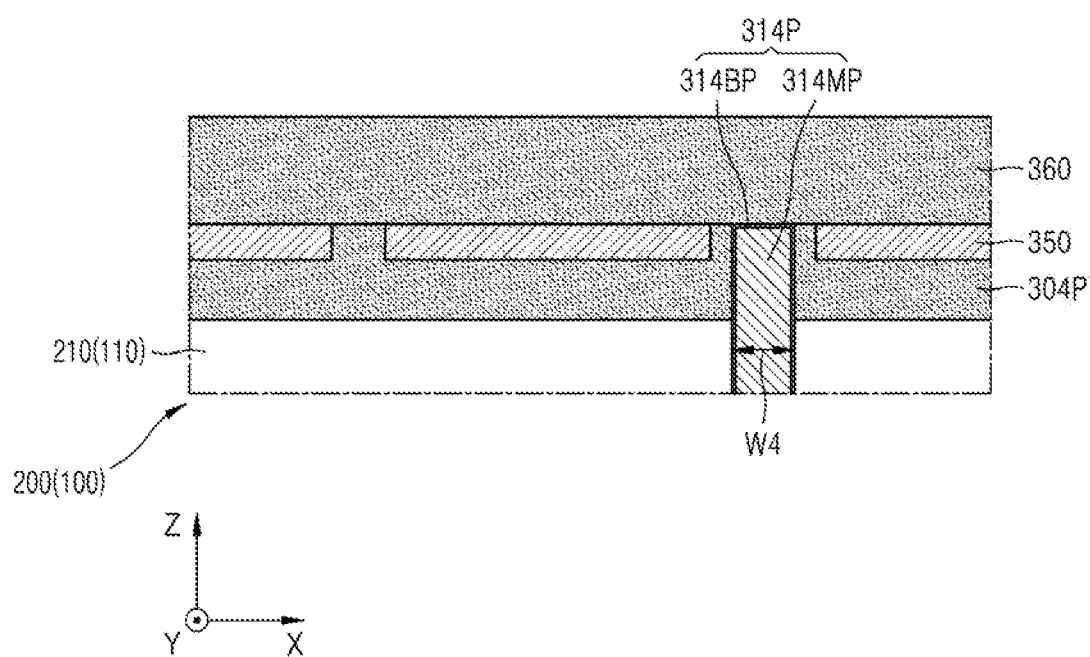

Referring to FIG. 3D, a cover insulation layer 360 covering the preliminary through via 314P, the preliminary rear insulation material layer 304P, and the align key pattern 350 may be formed. The cover insulation layer 360 may be formed to include a flat top surface. The cover insulation layer 360 may be formed to include silicon oxide. The cover insulation layer 360 may be formed by performing a chemical vapor deposition (CVD) process.

Figure 3E:
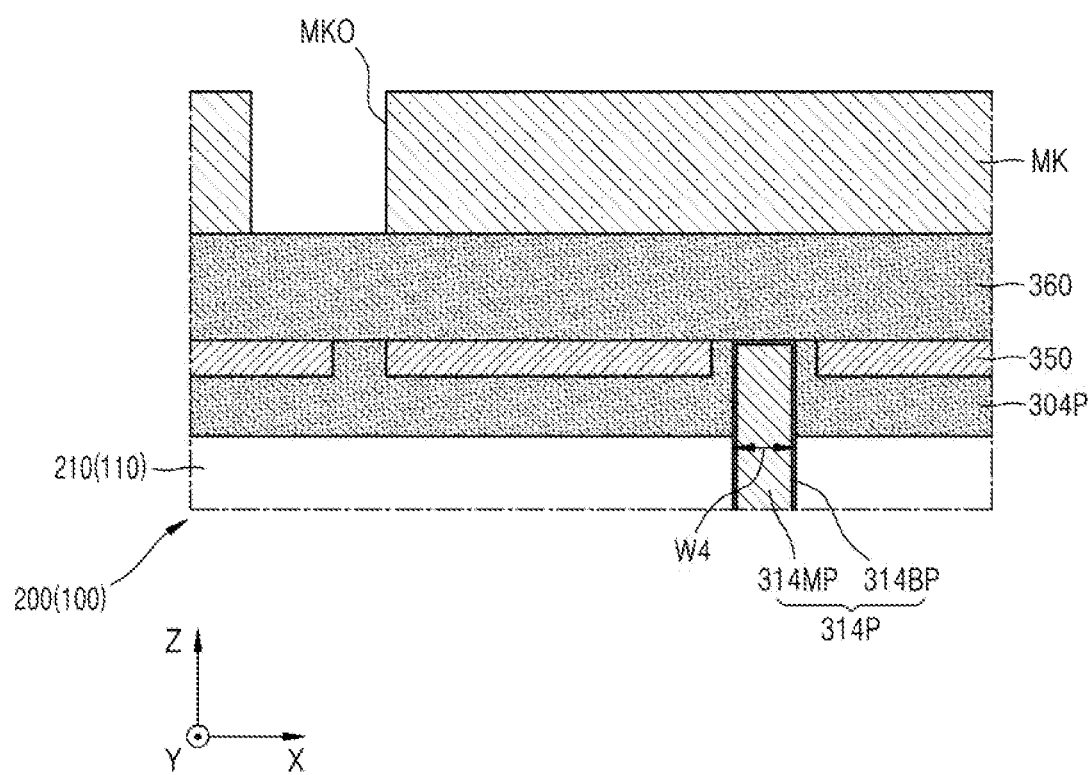

Referring to FIG. 3E, a mask pattern MK including an opening MKO may be formed on the cover insulation layer 360. The opening MKO may be formed to be disposed at a portion that is spaced apart from the preliminary through via 314P in a horizontal direction. The mask pattern MK including the opening MKO may be formed by using the align key pattern 350 as an align key. The mask pattern MK may be formed to include a photoresist.

Figure 3F:
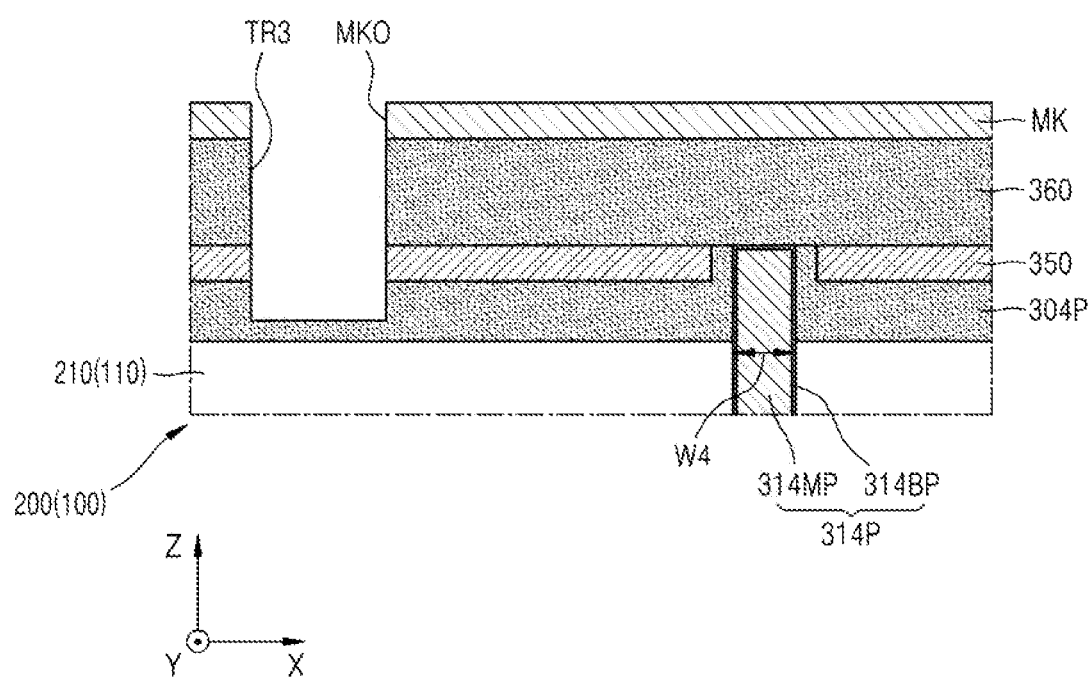

Referring to FIG. 3F, by using the mask pattern MK including the opening MKO as an etch mask, a third trench TR3 may be formed by removing a portion of the preliminary rear insulation material layer 304P and a portion of the cover insulation layer 360 corresponding to the opening MKO so that the second semiconductor substrate 210 is not exposed. Subsequently, the mask pattern MK may be removed.

The third trench TR3 may be formed to pass through the cover insulation layer 360 and a portion of the preliminary rear insulation material layer 304P, and not to extend to the top surface (i.e., the inactive surface) of the second semiconductor substrate 210. A portion of the preliminary rear insulation material layer 304P may be exposed at a bottom surface of the third trench TR3. The third trench TR3 may pass through the cover insulation layer 360 and the align key pattern 350, and may pass through a portion of the preliminary rear insulation material layer 304P.

Figure 3G:
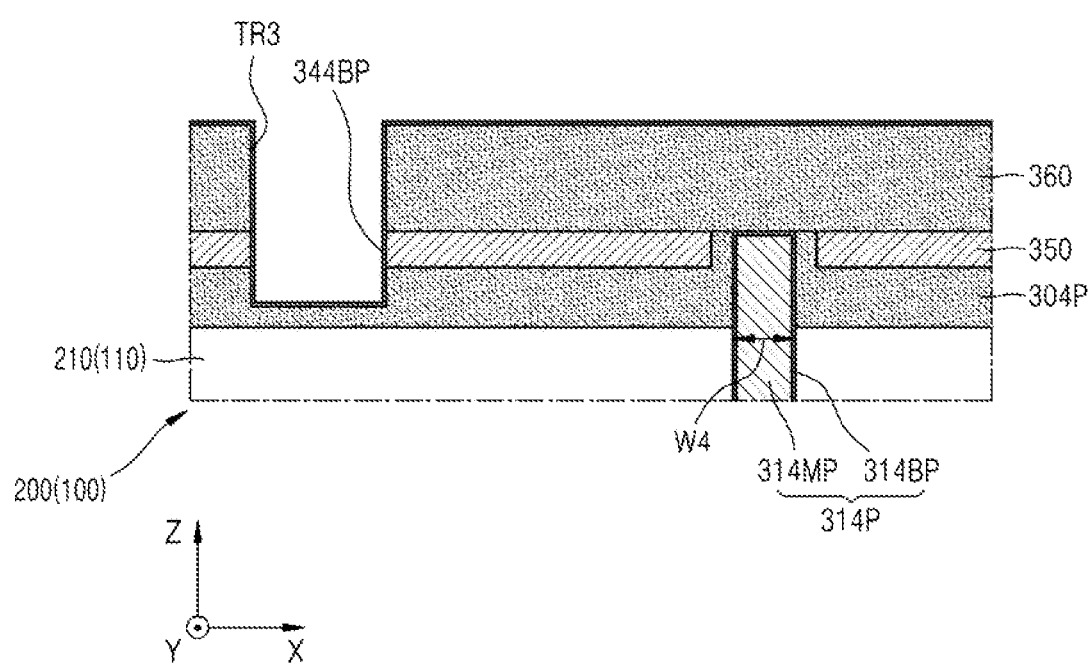

Referring to FIG. 3G, a preliminary rear barrier layer 344BP may be formed to conformally cover the bottom surface and an inner sidewall of the third trench TR3 and a top surface of the cover insulation layer 360. The preliminary rear barrier layer 344BP may be formed to include Ti, Ta, TiN, or TaN.

Figure 3H:
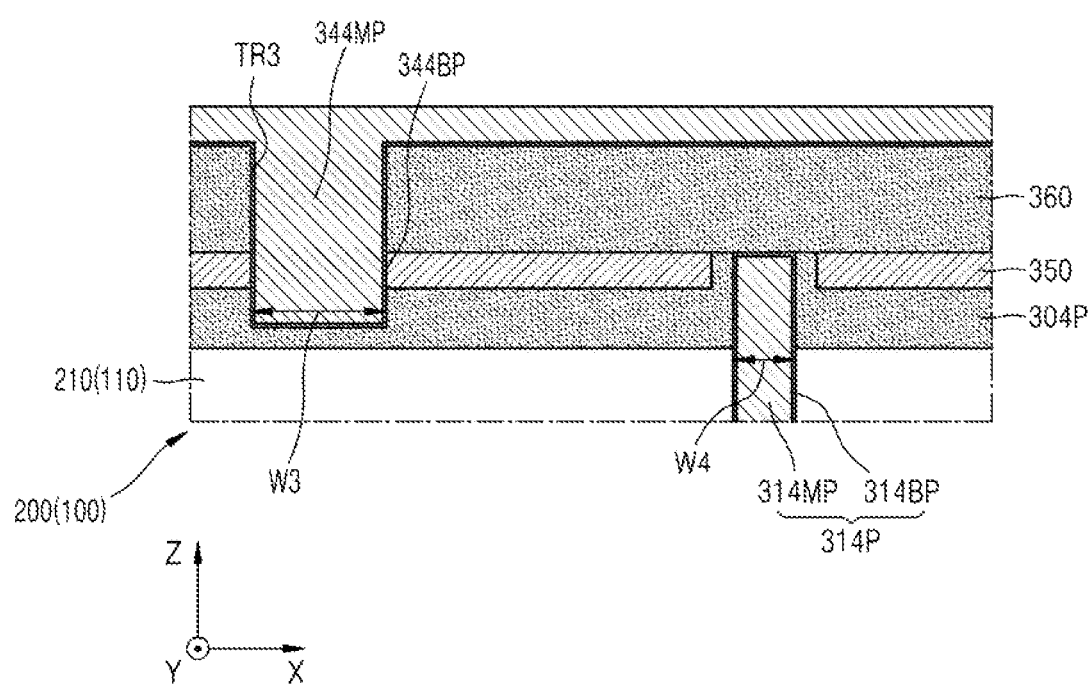
Figure 3I:
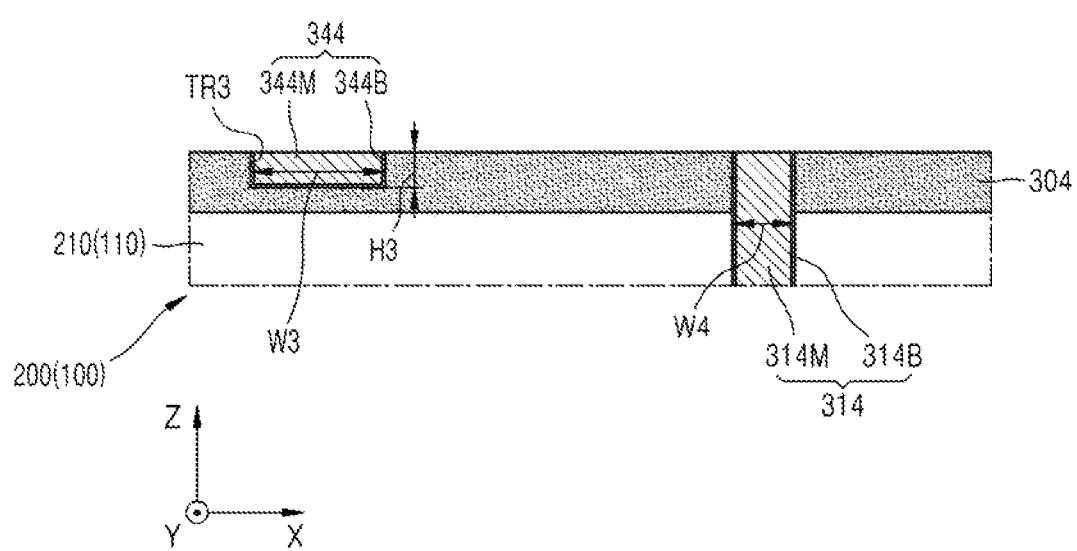

Referring to FIG. 3H, a preliminary rear conductive layer 344MP filling the third trench TR3 may be formed on the preliminary rear barrier layer 344BP. The preliminary rear conductive layer 344MP may be formed to include Cu.

Referring to FIGS. 3H and 3I, a rear thermal pad layer 344 (including the rear thermal conductive layer 344M and the rear thermal barrier layer 344B, a rear insulation material layer 304, and a through via 314 including the through barrier layer 314B and the through plug layer 314M) may be formed by removing a portion of an upper portion of the preliminary rear conductive layer 344MP, a portion of an upper portion of the preliminary rear barrier layer 344BP, the cover insulation layer 360, the align key pattern 350, a portion of an upper portion of the preliminary rear insulation material layer 304P, and a portion of an upper portion of the preliminary through via 314P.

In a process of forming the rear thermal pad layer 344 and the through via 314, all of the cover insulation layer 360 and the align key pattern 350 may be removed, and a portion of an upper portion of the preliminary rear insulation material layer 304P may be removed. Thus, the other portion thereof may remain as the rear insulation material layer 304. A top surface of the rear thermal pad layer 344, a top surface of the rear insulation material layer 304, and a top surface of the through via 314 may be formed to configure a coplanar surface.

The rear thermal pad layer 344 may be formed to have a third vertical height H3 and a third horizontal width W3. The through via 314 may be formed to have a fourth horizontal width W4.

A portion of the upper portion of the preliminary rear conductive layer 344MP, a portion of the upper portion of the preliminary rear barrier layer 344BP, the cover insulation layer 360, the align key pattern 350, a portion of the upper portion of the preliminary rear insulation material layer 304P, and a portion of the upper portion of the preliminary through via 314P may be removed by performing a chemical mechanical polishing (CMP) process.

The third vertical height H3 may be about 0.7 μm to about 1.5 μm. The fourth horizontal width W4 may about 2 μm to about 6 μm. The third horizontal width W3 may be about 0.5 to about 1.5 times the fourth horizontal width W4. In FIG. 3I, it is illustrated that the third horizontal width W3 is greater than the fourth horizontal width W4, as an example.

FIGS. 4A to 12 are cross-sectional views and partially enlarged cross-sectional views illustrating a method of manufacturing a semiconductor package, according to an example embodiment.

Figure 4A:
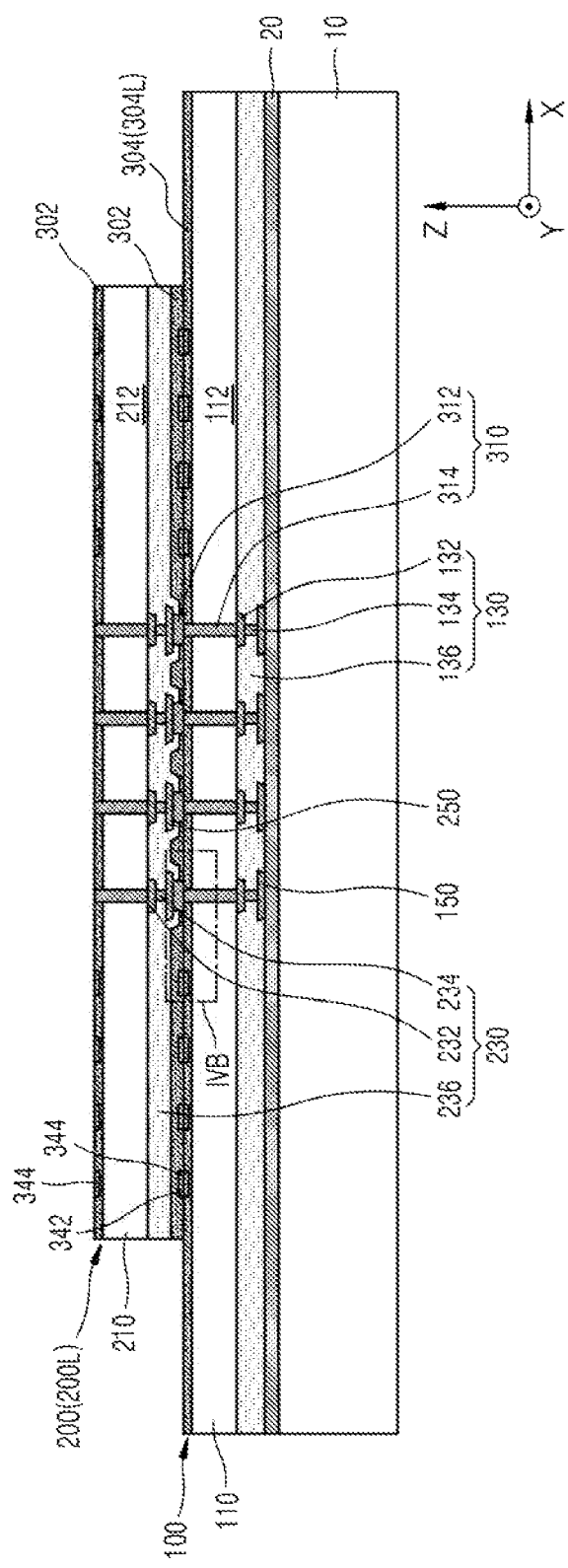
FIGS. 4A to 12 are cross-sectional views and partially enlarged cross-sectional views illustrating a method of manufacturing a semiconductor package, according to an example embodiment.
Figure 4B:
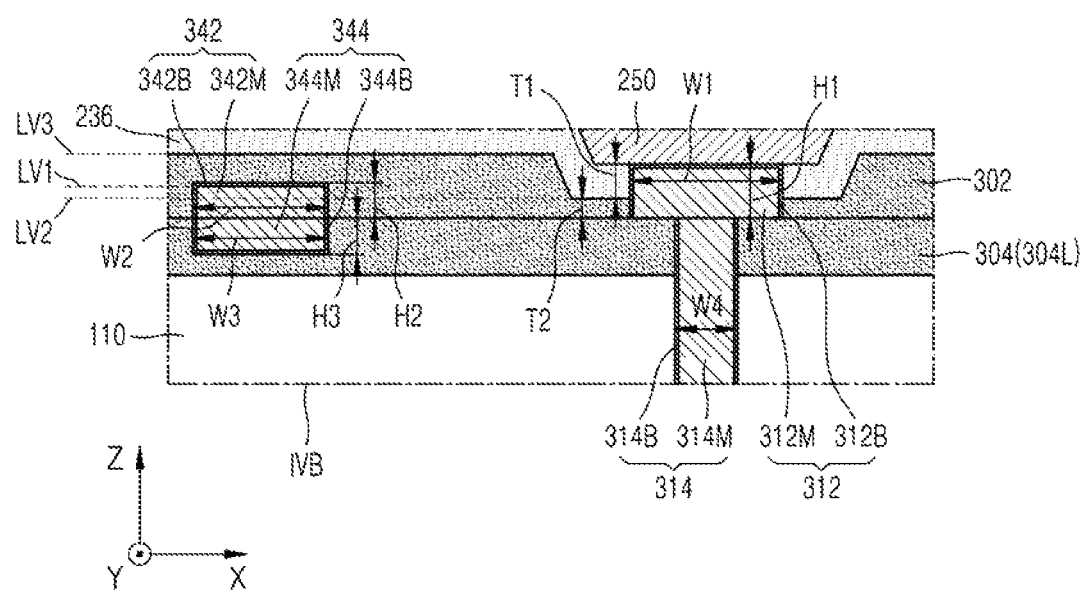
Figure 5A:
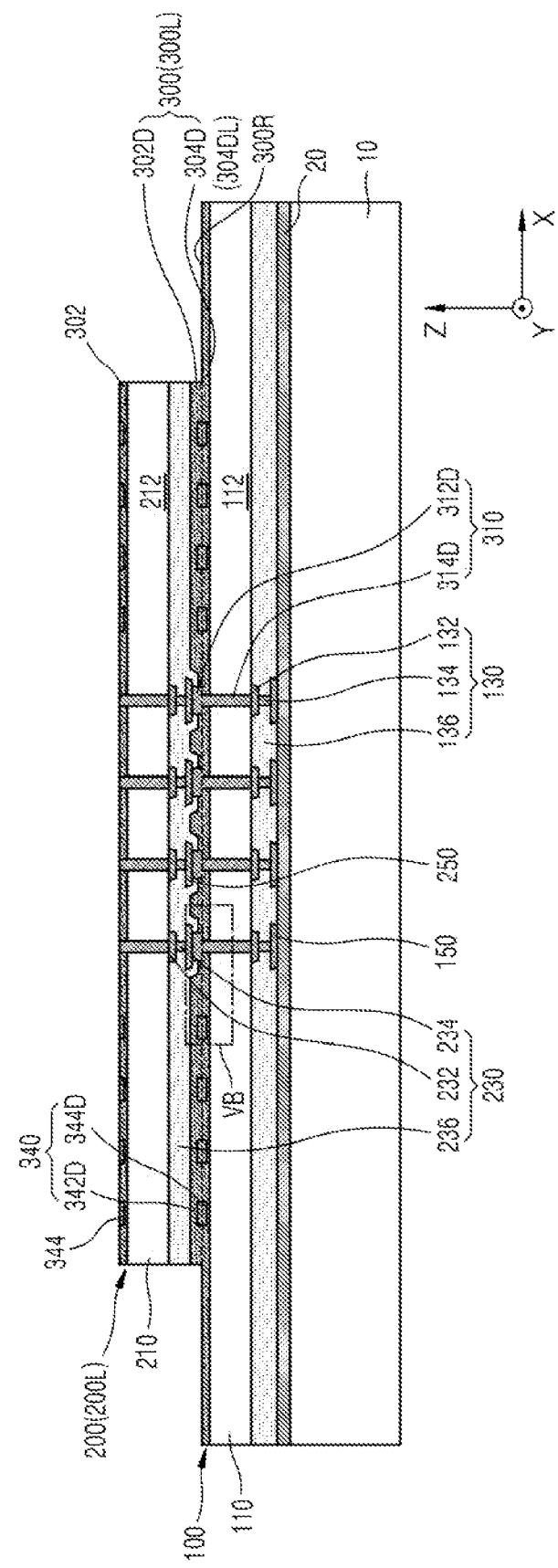
Figure 5B:
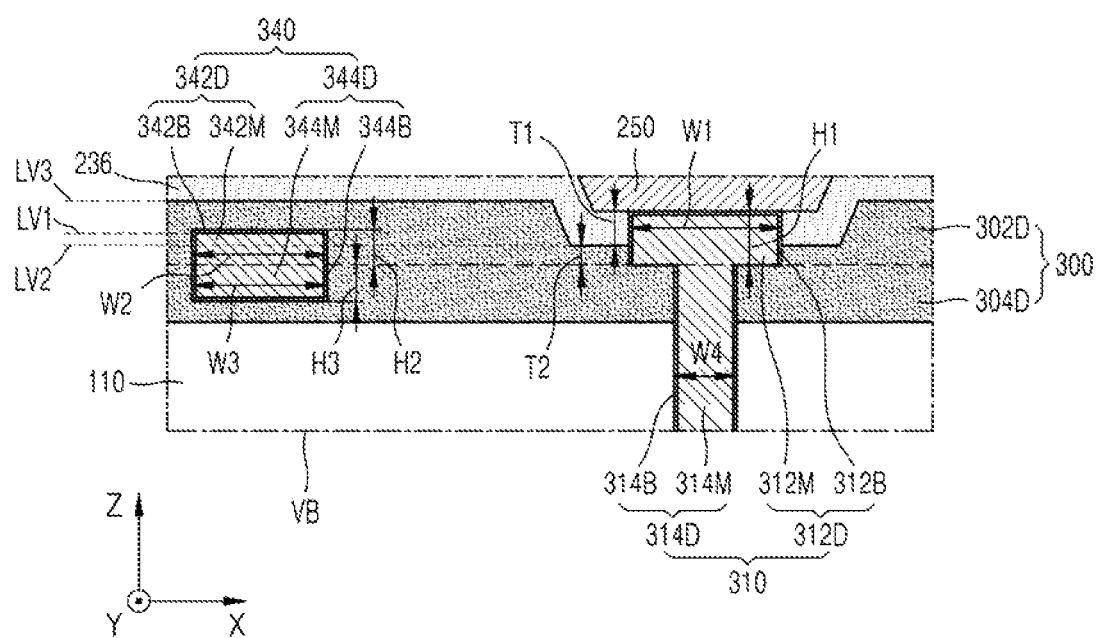
Figure 6A:
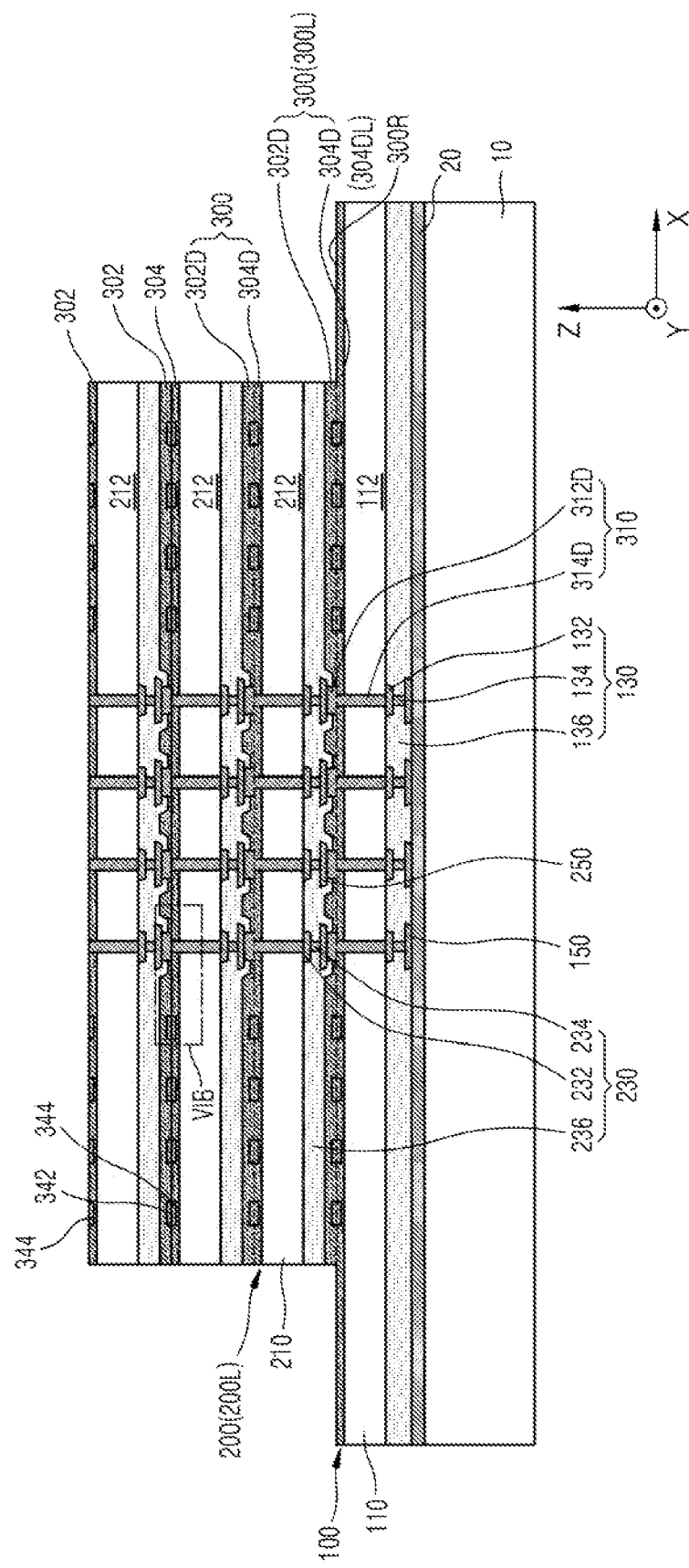
Figure 6B:
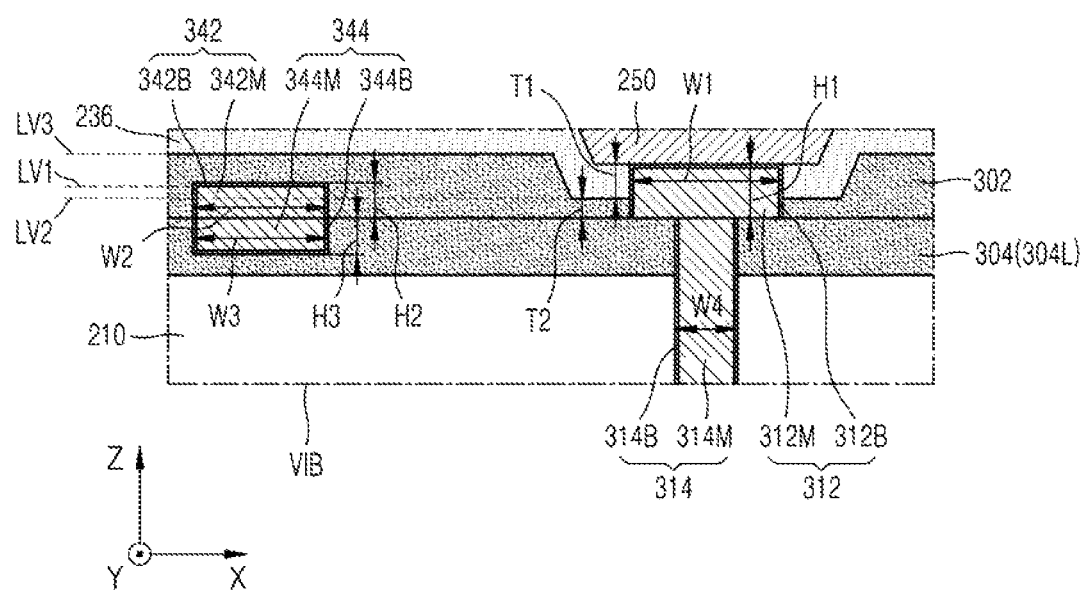
Figure 7A:
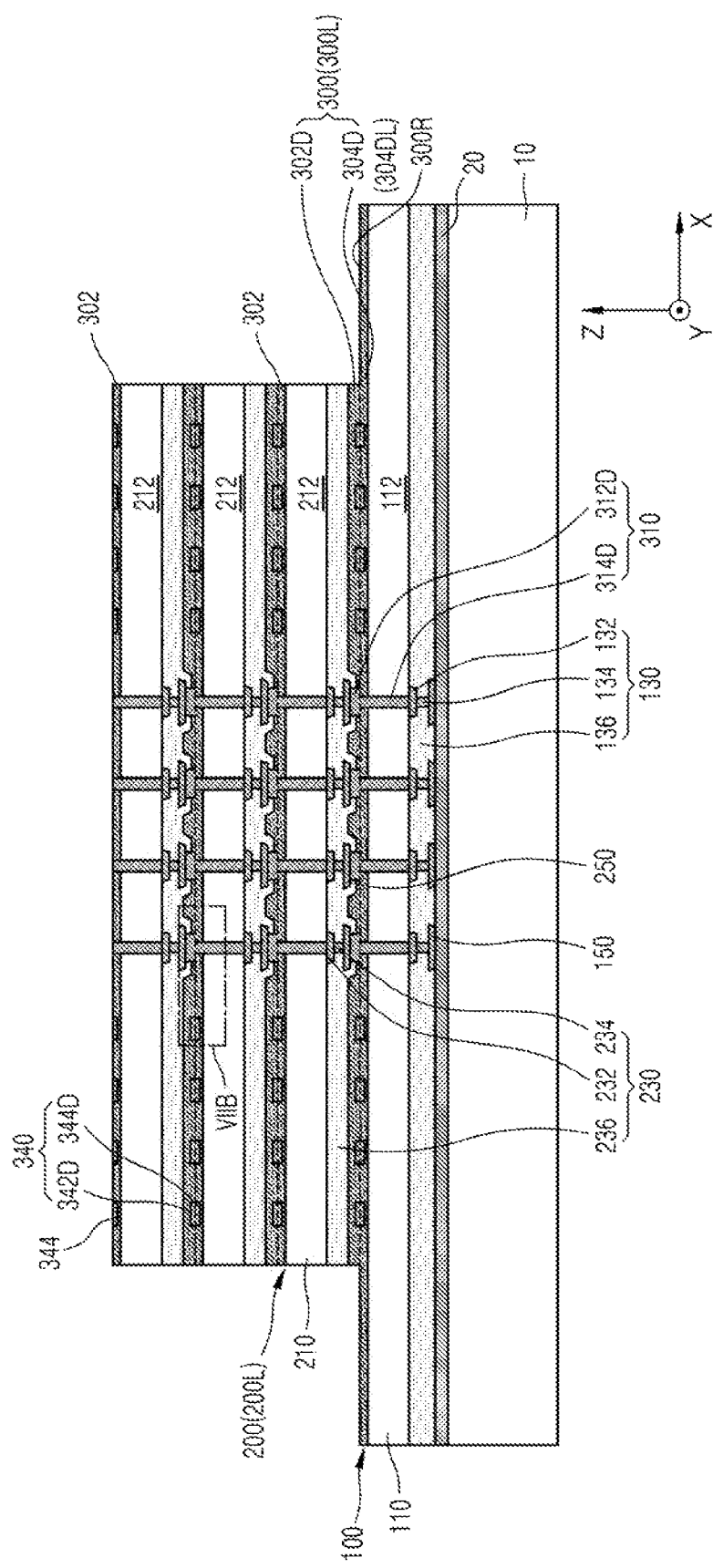
Figure 7B:
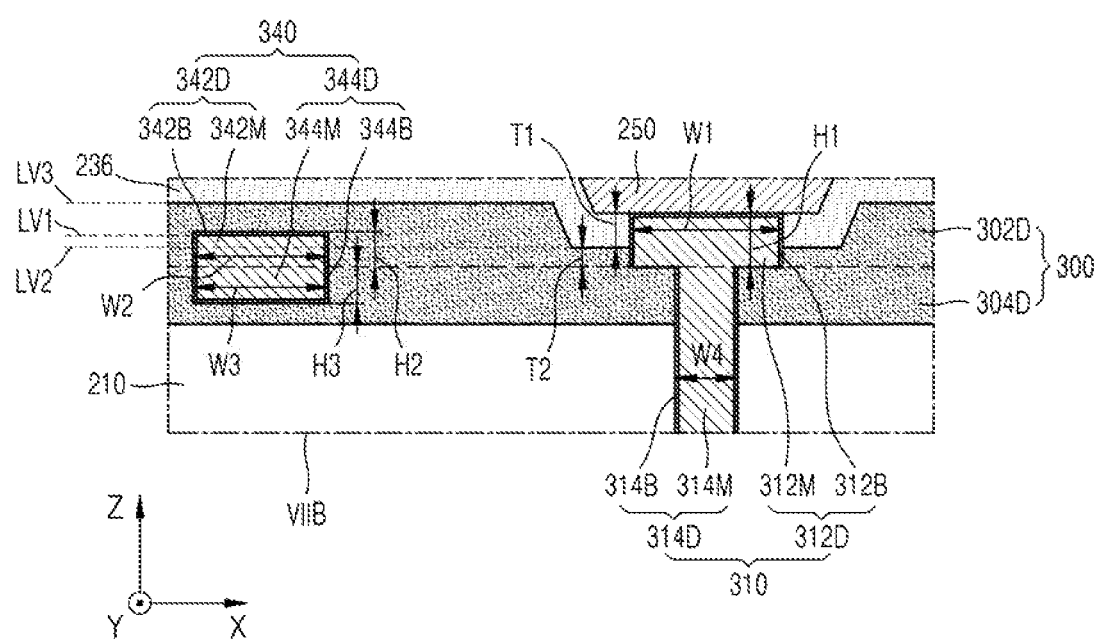
Figure 8:
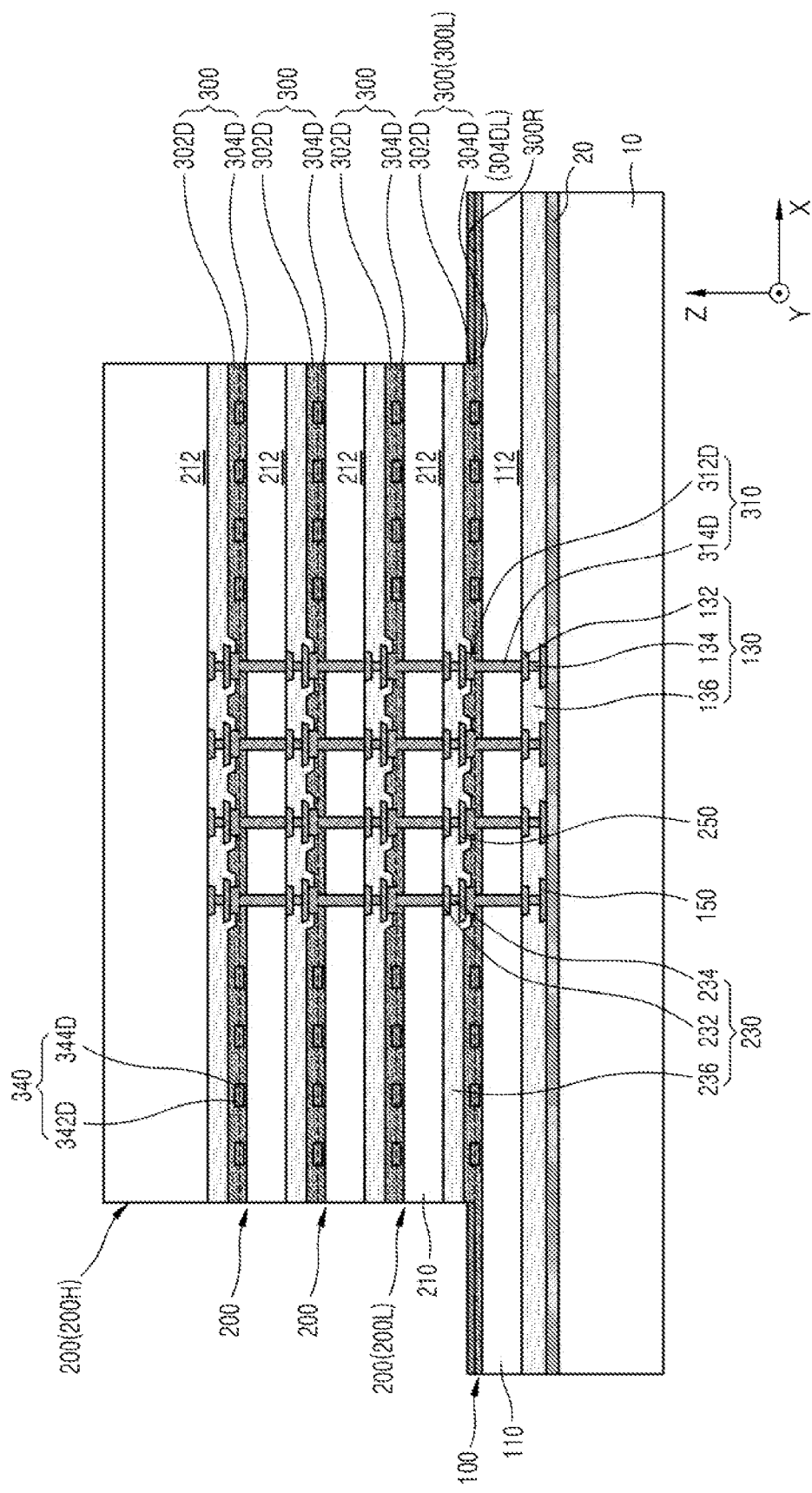

FIG. 4B is a cross-sectional view of an enlarged region IVB of FIG. 4A. FIG. 5B is a cross-sectional view of an enlarged region VB of FIG. 5A. FIG. 6B is a cross-sectional view of an enlarged region VIB of FIG. 6A. FIG. 7B is a cross-sectional view of an enlarged region VIM of FIG. 7A.

FIGS. 4A to 12 are cross-sectional views and partially enlarged cross-sectional views illustrating a method of manufacturing the semiconductor package 1000 illustrated in FIGS. 1A and 1B, and illustrate a method of manufacturing the semiconductor package 1000 including the semiconductor chip (i.e., the first semiconductor chip 100 and the second semiconductor chip 200) manufactured by the manufacturing method described above with reference to FIGS. 2A to 2C and 3A to 3I. Thus, in FIGS. 4A to 12, the same reference numerals as FIGS. 1A to 3I refer to like elements and repeated descriptions may be omitted.

Referring to FIGS. 4A and 4B, the first semiconductor chip 100 may be attached on a first supporting substrate 10. As described above FIGS. 3A to 3I, the rear insulation material layer 304, the plurality of through vias 314, and the plurality of rear thermal pad layers 344 may be formed on the first semiconductor chip 100. A first release film 20 may be attached on a top surface of the first supporting substrate 10. Then, the first semiconductor chip 100 may be attached on the first release film 20. The first semiconductor chip 100 may be attached on the first release film 20 so that the first wiring structure layer 130 faces the first supporting substrate 10.

The second semiconductor chip 200 may be disposed on the first semiconductor chip 100. As described above with reference to FIGS. 2A to 2C, the front insulation material layer 302, the plurality of front pads 312, and the plurality of front thermal pad layers 342 may be formed in the second semiconductor chip 200. As described above with reference to FIGS. 3A to 3I, the rear insulation material layer 304, the plurality of through vias 314, and the plurality of rear thermal pad layers 344 may be formed in the second semiconductor chip 200. The second semiconductor chip 200 may be disposed on the first semiconductor chip 100 so that the plurality of front pads 312 of the second semiconductor chip 200 correspond to the plurality of through vias 314 of the first semiconductor chip 100, and the plurality of front thermal pad layers 342 of the second semiconductor chip 200 correspond to the plurality of rear thermal pad layers 344 of the first semiconductor chip 100.

The second semiconductor chip 200 may be the lowermost second semiconductor chip 200L illustrated in FIG. 1A. The lowermost second semiconductor chip 200L may be disposed on the first semiconductor chip 100 so that the front insulation material layer 302 faces the rear insulation material layer 304 of the first semiconductor chip 100. The rear insulation material layer 304 of the first semiconductor chip 100 may be referred to as a lowermost rear insulation material layer 304L, so as to be differentiated from the rear insulation material layer 304 of the second semiconductor chip 200. A horizontal width of the lowermost rear insulation material layer 304L of the first semiconductor chip 100 may be greater than a horizontal width of the rear insulation material layer 304 of the second semiconductor chip 200.

Referring to FIGS. 4A to 5B, by applying heat and/or pressure in a process of placing the lowermost second semiconductor chip 200L on the first semiconductor chip 100, the front insulation material layer 302, the plurality of front pads 312, and the plurality of front thermal pad layers 342 of the lowermost second semiconductor chip 200L may be bonded to the lowermost rear insulation material layer 304L, the plurality of through vias 314, and the plurality of rear thermal pad layers 344 of the first semiconductor chip 100 respectively corresponding thereto. The front insulation material layer 302 and the lowermost rear insulation material layer 304L may be bonded to each other to form a covalent bond. The plurality of front pads 312 and the plurality of through vias 314 corresponding to each other may be bonded to each other to form a covalent bond. The plurality of front thermal pad layers 342 and the plurality of rear thermal pad layers may be bonded to each other to form a covalent bond. Heat having a first temperature may be applied in a process of placing the lowermost second semiconductor chip 200L on the first semiconductor chip 100.

Subsequently, a bonding insulation material layer 300 may be formed where the front insulation material layer 302 and the lowermost rear insulation material layer 304L are bonded to each other, a plurality of bonding pads 310 where the plurality of front pads 312 and the plurality of through vias 314 corresponding to each other are bonded to each other, and a plurality of bonding thermal pads 340 where the plurality of front thermal pad layers 342 and the plurality of rear thermal pad layers 344 are bonded to each other by applying heat having a second temperature, which is higher than the first temperature. The plurality of front pads 312 and the plurality of through vias 314 corresponding to each other and the plurality of bonding thermal pads 340 where the plurality of front thermal pad layers 342 and the plurality of rear thermal pad layers 344 are bonded to each other may be bonded to each other through expansion based on heat. Then, the plurality of bonding pads 310 and the plurality of bonding thermal pads 340 may be diffusion-bonded to each other to configure one body, on the basis of diffusion of metal elements included therein. The bonding insulation material layer 300 disposed between the lowermost second semiconductor chip 200L and the first semiconductor chip 100 may be referred to as a lowermost bonding insulation material layer 300L.

Referring to FIGS. 6A to 8, a plurality of second semiconductor chips 200 may be sequentially disposed on the lowermost second semiconductor chip 200L. The front insulation material layer 302, the plurality of front pads 312, and the plurality of front thermal pad layers 342 may be disposed on bottom surfaces of the plurality of second semiconductor chips 200. The rear insulation material layer 304, the plurality of through vias 314, and the plurality of rear thermal pad layers 344 may be disposed on top surfaces of the other second semiconductor chips 200 except the uppermost second semiconductor chip 200H.

Subsequently, by using a method similar to the descriptions of FIGS. 5A and 5B, the bonding insulation material layer 300 (where the front insulation material layer 302 and the rear insulation material layer 304 are bonded to each other, the plurality of bonding pads 310 where the plurality of front pads 312 and the plurality of through vias 314 corresponding to each other are bonded to each other, and the plurality of bonding thermal pads 340 where the plurality of front thermal pad layers 342 and the plurality of rear thermal pad layers 344 are bonded to each other) may be formed between the plurality of second semiconductor chips 200. Thus, the plurality of second semiconductor chips 200 may be sequentially attached on the first semiconductor chip 100.

Figure 9:
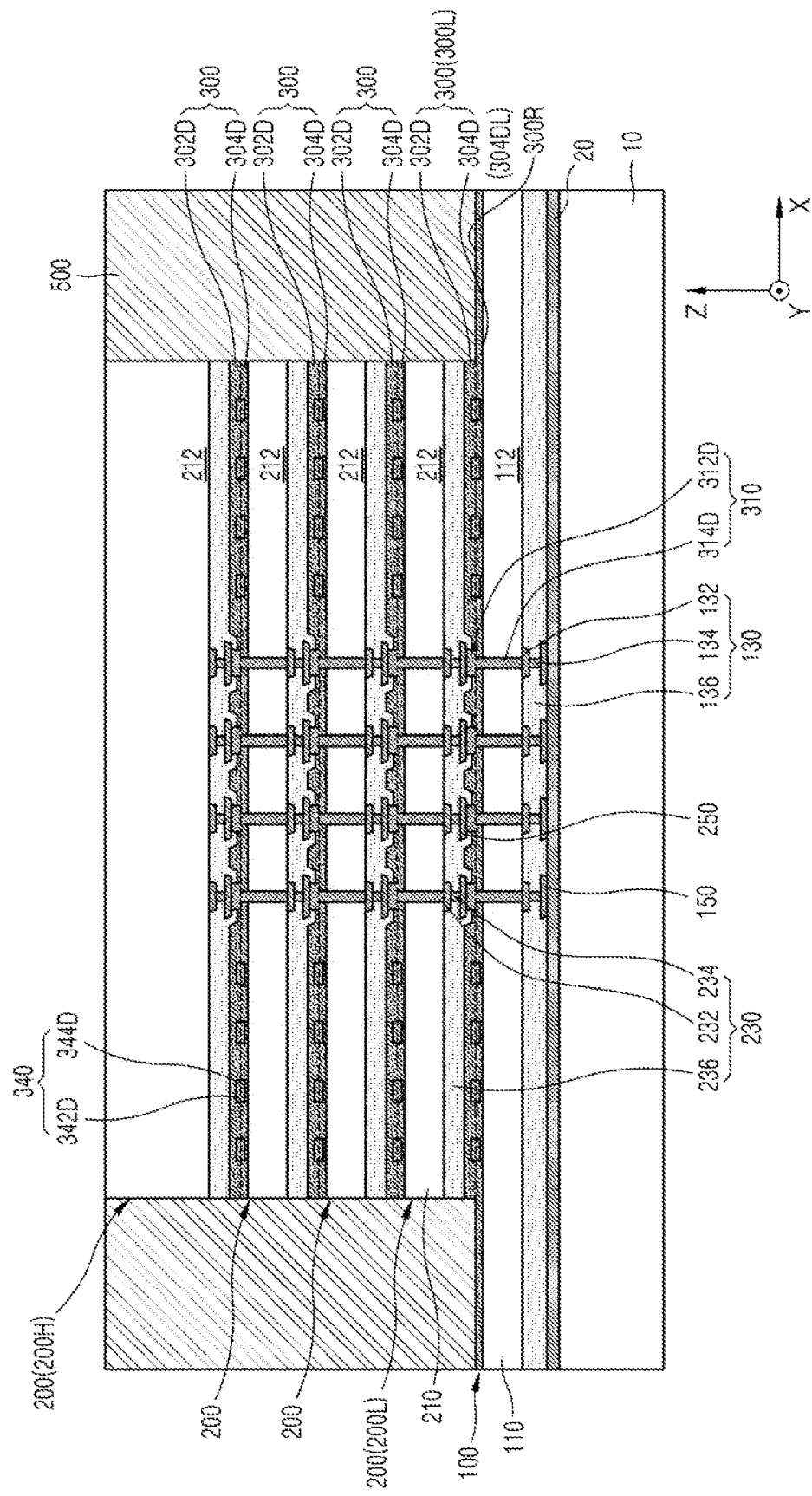

Referring to FIG. 9, the package molding layer 500 covering the top surface of the first semiconductor chip 100 and surrounding side surfaces of a supporting dummy substrate 400 and the plurality of second semiconductor chips 200 may be formed on the first semiconductor chip 100. The package molding layer 500 may not cover and may expose a top surface of the uppermost second semiconductor chip 200H, or the package molding layer 500 may cover the top surface of the uppermost second semiconductor chip 200H.

After the package molding layer 500 is formed, a first supporting substrate 10 with the first release film 20 attached thereon may be detached from the first semiconductor chip 100.

Figure 10:
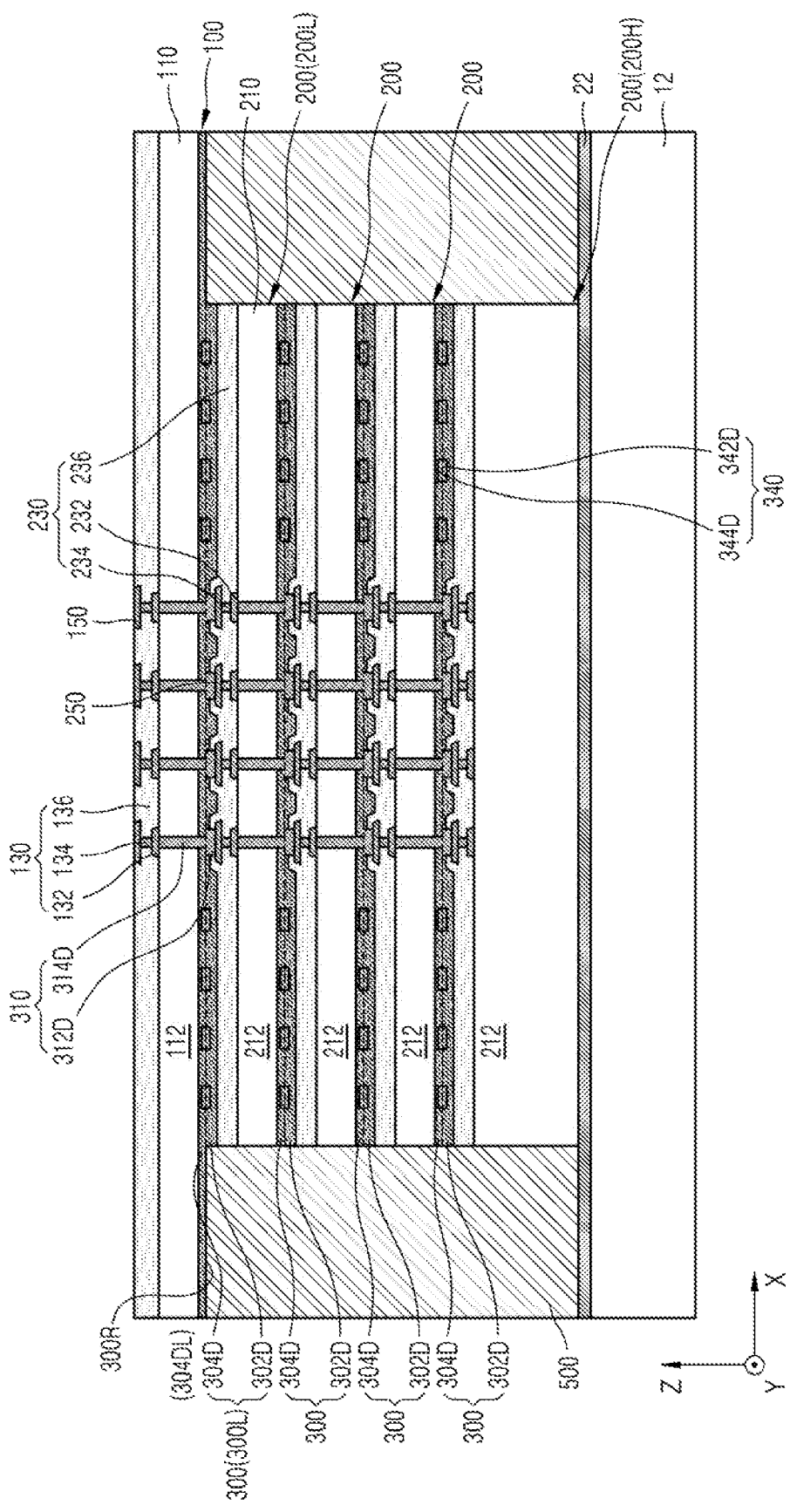

Referring to FIG. 10, a resultant material of FIG. 9 may be reversed and may be attached on a second supporting substrate 12. A second release film 22 may be attached on a top surface of a second supporting substrate 12. Then, the reversed resultant material of FIG. 9 may be attached on the second release film 22. The uppermost second semiconductor chip 200H and the package molding layer 500 may contact the second release film 22, or the package molding layer 500 may contact the second release film 22.

Figure 11:
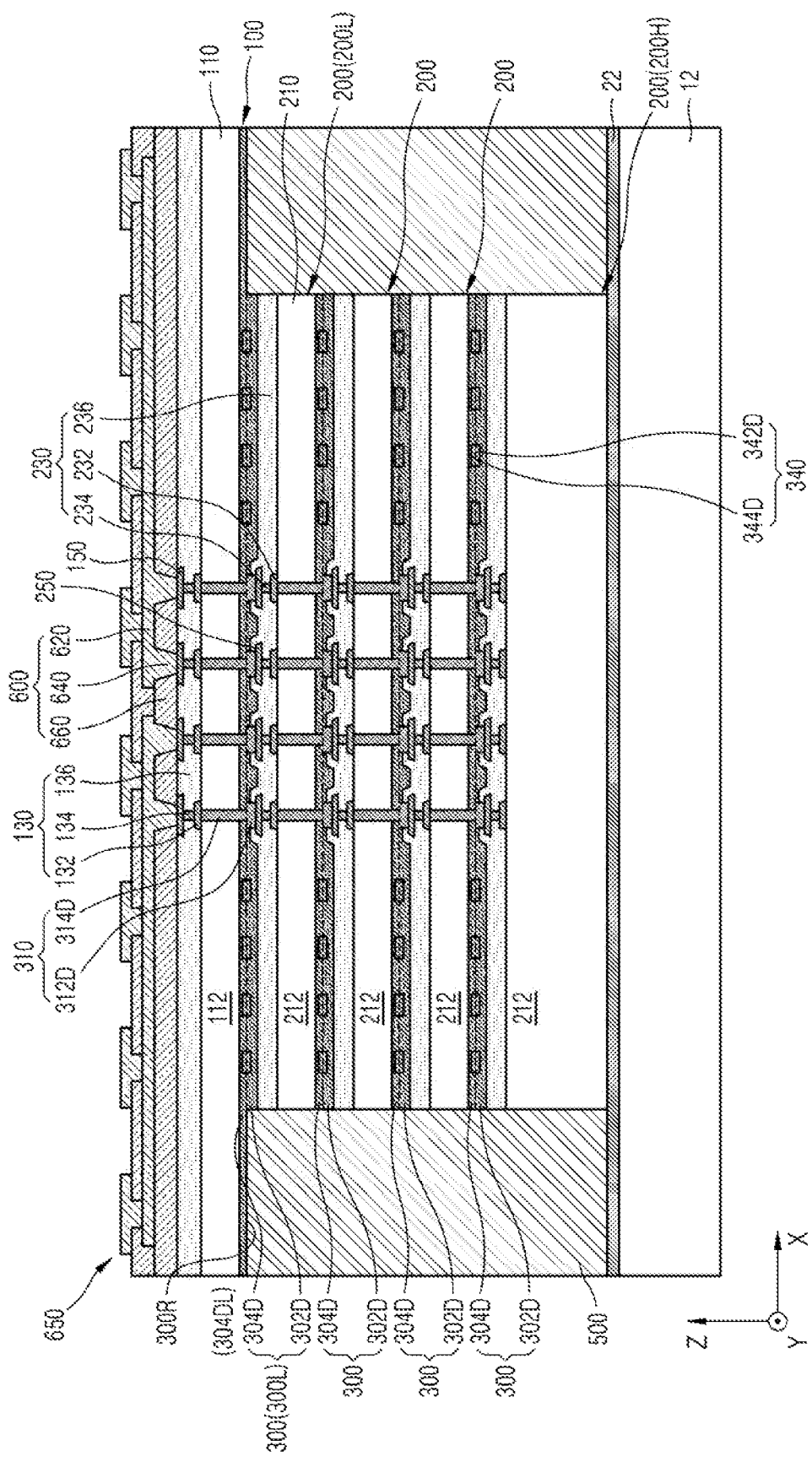

Referring to FIG. 11, the base redistribution layer 600 may be formed on the first wiring structure layer 130 of the first semiconductor chip 100. The base redistribution layer 600 may include a redistribution interposer. The base redistribution layer 600 may be formed to include the plurality of package redistribution line patterns 620, the plurality of package redistribution vias 640, and the package redistribution insulation layer 660. At least some of the plurality of package redistribution vias 640 and at least some of the plurality of package redistribution line patterns 620 may be formed to contact the plurality of first chip pads 150.

The plurality of package redistribution vias 640 may be formed to have a tapered shape, in which a horizontal width narrows and extends from a lower portion to an upper portion. Thus, the plurality of package redistribution vias 640 may have a horizontal width which is widened as the plurality of package redistribution vias 640 are farther away from the first semiconductor chip 100.

Figure 12:
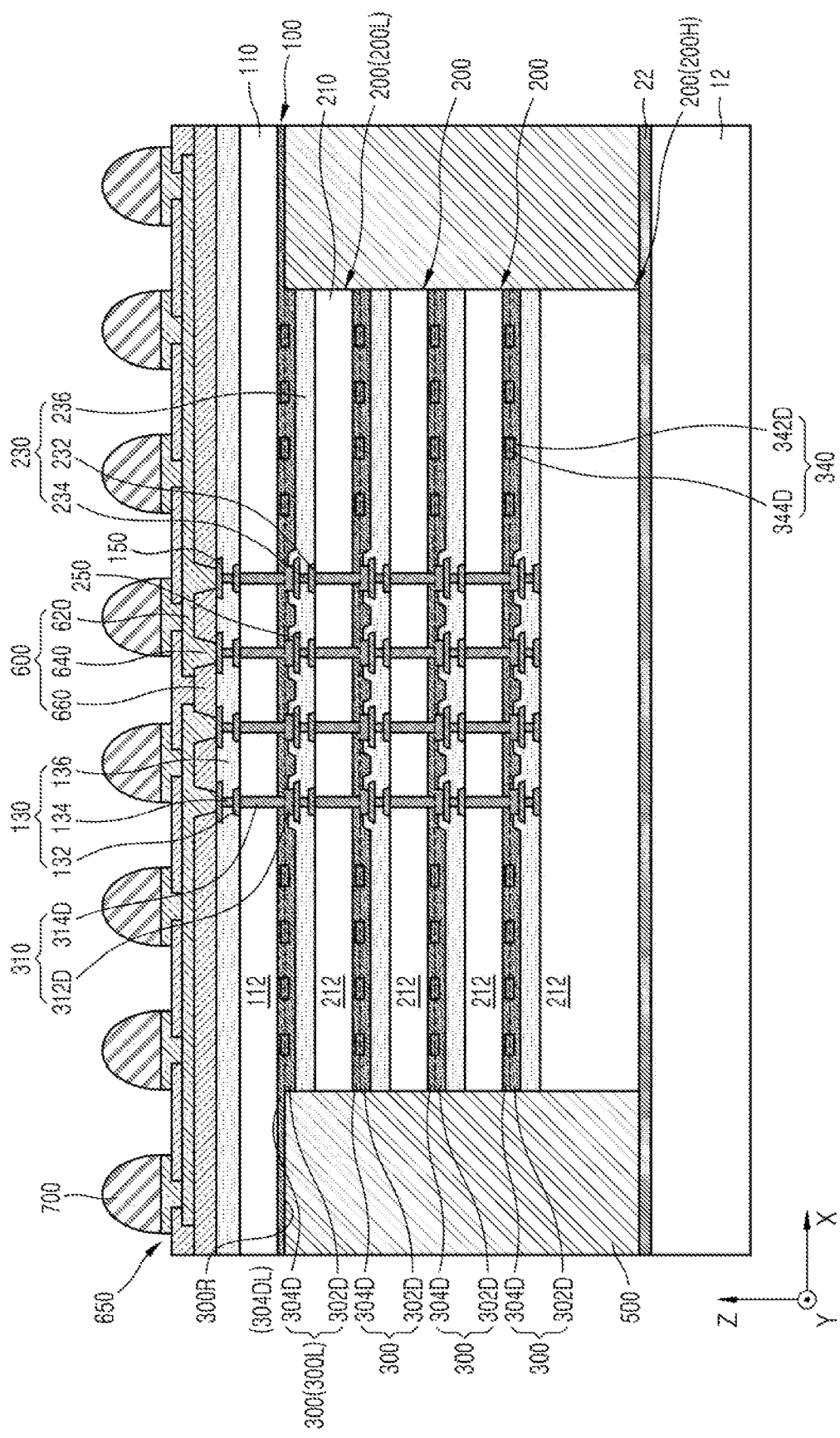

Referring to FIG. 12, the plurality of package connection terminals 700 may be attached on the plurality of package pads 650. Subsequently, the second supporting substrate 12 with the second release film 22 attached thereon may be detached from the package molding layer 500. Then, a resultant material thereof may be reversed, thereby forming the semiconductor package 1000 illustrated in FIGS. 1A and 1B.

Instead of forming the base redistribution layer 600, the semiconductor package 1000 may be formed by attaching the first semiconductor chip 100, on which the plurality of second semiconductor chips 200 are stacked, on a silicon interposer.

Referring to FIGS. 2A to 12, in a method of manufacturing the semiconductor package 1000, the bonding pad 310 may be formed by bonding the front pad 312 to the through via 314. Thus, a separate element (e.g., an element having a wider horizontal width than the through via 314 like the front pad 312) for bonding the front pad 312 to the through via 314 may not be needed, thereby reducing the number of manufacturing processes. Further, an error such as dishing may be prevented from occurring in performing a CMP process for forming the rear thermal pad layer 344 and the through via 314, and thus, bonding reliability may be enhanced in a process of bonding the through via 314 to the front pad 312 for forming the bonding pad 310. Therefore, the reliability of an electrical connection between the first semiconductor chip 100 and the plurality of second semiconductor chips 200 in the semiconductor package 1000 may be enhanced. Thus, the operation reliability of the semiconductor package 1000 may be enhanced.

Figure 13A:
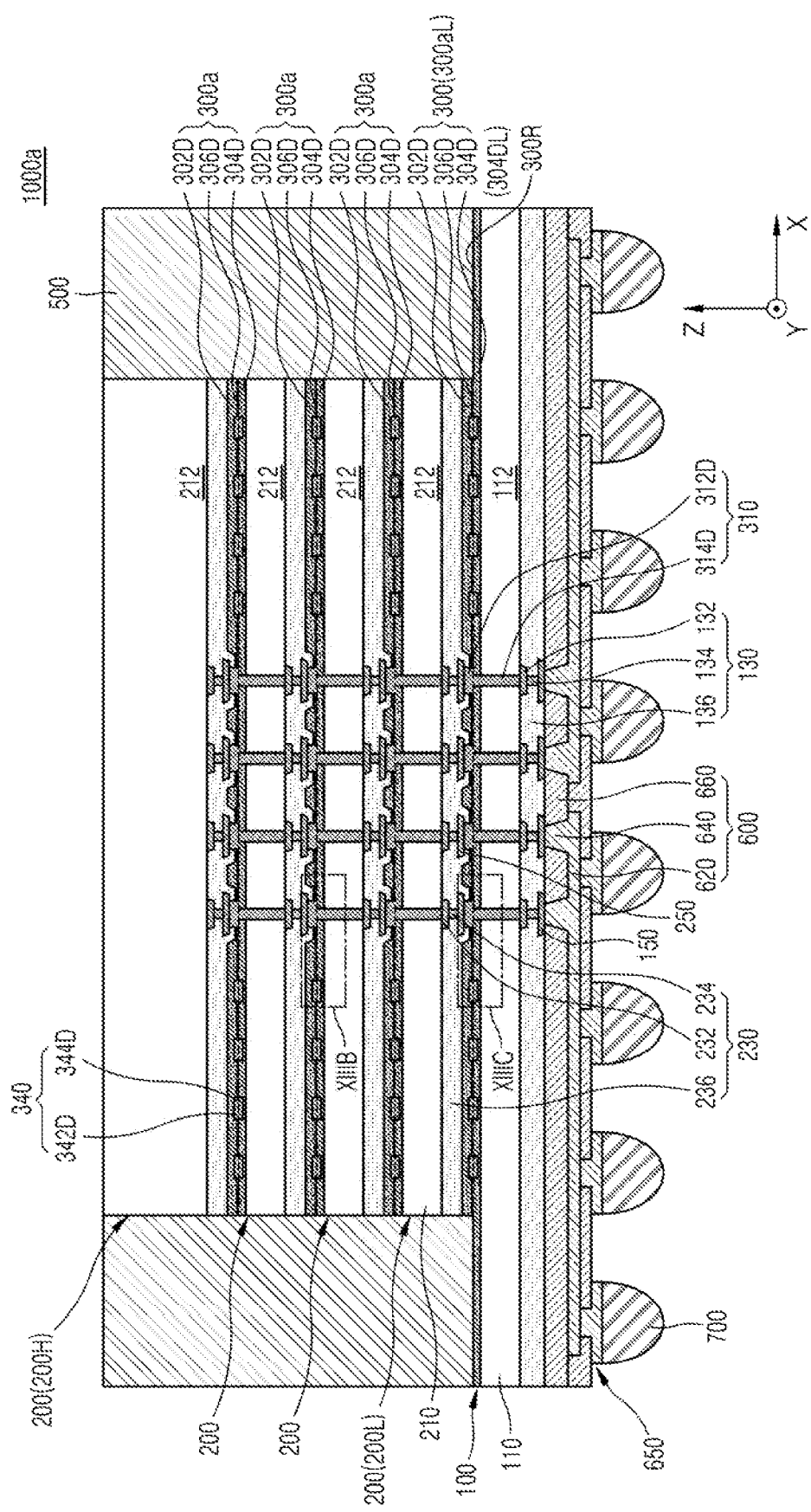
FIG. 13A is a cross-sectional view illustrating a semiconductor package according to an example embodiment.
Figure 13B:
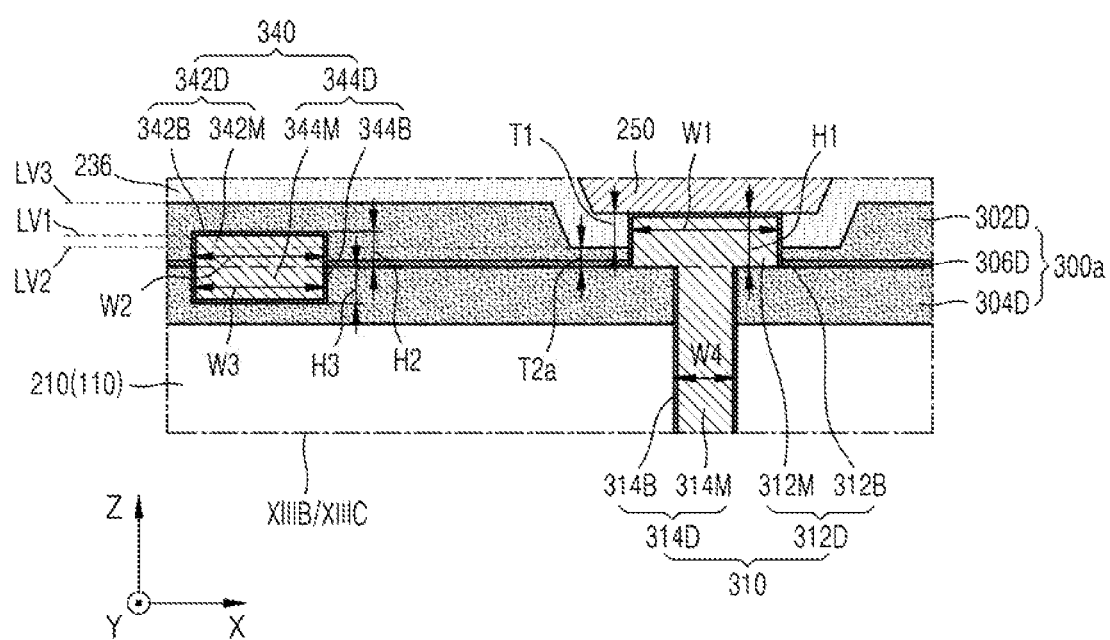
FIG. 13B is a partially enlarged cross-sectional view illustrating a portion of a semiconductor package according to an example embodiment.

FIG. 13A is a cross-sectional view illustrating a semiconductor package according to an example embodiment, and FIG. 13B is a partially enlarged cross-sectional view illustrating a portion of a semiconductor package according to an example embodiment.

In detail, FIG. 13B is a cross-sectional view illustrating an enlarged region XIIIB or region XIIIC of FIG. 13A. The region XIIIB of FIG. 13A may include a portion of the second semiconductor substrate 210. The region XIIIC of FIG. 13A may include a portion of the first semiconductor substrate 110. Other elements except the portion of the second semiconductor substrate 210 and the portion of the first semiconductor substrate 110 may be substantially the same. In FIGS. 13A and 13B, the same reference numerals as FIGS. 1A to 12I refer to like elements, and repeated descriptions may be omitted.

Referring to FIGS. 13A and 13B, a semiconductor package 1000a may include a first semiconductor chip 100 and a plurality of second semiconductor chips 200, which are sequentially stacked in a vertical direction (a Z direction). The first semiconductor chip 100 and the plurality of second semiconductor chips 200 may be electrically connected to each other through a plurality of bonding pads 310 to exchange a signal and provide power and ground.

A bonding insulation material layer 300a, surrounding the plurality of bonding pads 310, may be disposed between the first semiconductor chip 100 and a lowermost second semiconductor chip 200L and between two adjacent second semiconductor chips 200 of the plurality of second semiconductor chips 200. The bonding insulation material layer 300a may be formed by a process in which an insulation material layer is separately formed on each of surfaces facing each other of two adjacent chips of the plurality of second semiconductor chips 200 and the first semiconductor chip 100, and then, insulation material layers facing each other are bonded to form one body through a covalent bond. For example, the bonding insulation material layer 300a may be formed by a process where a junction insulation material layer 306 covering the front insulation material layer 302 illustrated in FIG. 14B and the rear insulation material layer 304 illustrated in FIG. 13I, facing each other, expand based on heat and contact each other and are bonded to each other through a covalent bond.

The bonding insulation material layer 300a may include a front insulation material portion 302D, a bonding insulation material portion 306D, and a rear insulation material portion 304D. The front insulation material portion 302D and the rear insulation material portion 304D may include silicon oxide such as TEOS. The bonding insulation material portion 306D may include SiCN. The front insulation material portion 302D and the bonding insulation material portion 306D may each be a portion, surrounding a pad portion 312D, of the bonding insulation material layer 300a. The rear insulation material portion 304D may be a portion, surrounding a through via portion 314D, of the bonding insulation material layer 300a. The front insulation material portion 302D and the bonding insulation material portion 306D may be portions respectively corresponding to the front insulation material layer 302 and the junction insulation material layer 306 each illustrated in FIG. 14B. The rear insulation material portion 304D may be a portion corresponding to the rear insulation material layer 304 illustrated in FIG. 3I.

The front insulation material portion 302D may cover a second inter-wiring insulation layer 236. The bonding insulation material portion 306D may cover the front insulation material portion 302D. An upper surface of a second chip pad 250 may be covered by the second inter-wiring insulation layer 236, and a lower surface thereof may be covered by the front insulation material portion 302D and the bonding insulation material portion 306D. The rear insulation material portion 304D may surround the through via portion 314D.

A bonding insulation material layer 300a that is disposed between the first semiconductor chip 100 and the lowermost second semiconductor chip 200L may be referred to as a lowermost bonding insulation material layer 300aL. A rear insulation material portion 304D that covers an inactive surface of the first semiconductor substrate 110 may be referred to as a lowermost rear insulation material portion 304DL.

The semiconductor package 1000a may include a plurality of bonding thermal pads 340 that are surrounded by the bonding insulation material layer 300a and are spaced apart from the plurality of bonding pads 310 in a horizontal direction. A top surface, a bottom surface, and a side surface of each of the plurality of bonding pads 310 may be fully covered by the bonding insulation material layer 300a. A top surface and an upper side surface of the bonding thermal pad 340 may be covered by the front insulation material portion 302D. A bottom surface and a lower side surface of the bonding thermal pad 340 may be covered by the rear insulation material portion 304D. The bonding insulation material portion 306D may be disposed between the front insulation material portion 302D and the rear insulation material portion 304D, and may cover a portion of a side surface of the bonding thermal pad 340. The bonding thermal pad 340 may include a front thermal pad portion 342D and a rear thermal pad portion 344D. The front thermal pad portion 342D may be a portion, surrounded by the front insulation material portion 302D and the bonding insulation material portion 306D, of the front thermal pad portion 342D. The rear thermal pad portion 344D may be a portion, surrounded by the rear insulation material portion 304D, of the bonding thermal pad 340.

The plurality of bonding pads 310 may fully pass through the bonding insulation material layer 300a and may be buried into the bonding insulation material layer 300a without passing through the bonding insulation material layer 300a. A top surface of each of the plurality of bonding thermal pads 340 may be disposed at a first vertical level LV1. An interface between the second inter-wiring insulation layer 236 and the bonding insulation material layer 300a may have a lowest vertical level that is adjacent to the plurality of bonding pads 310 and is disposed at a second vertical level LV2, or may have a highest vertical level that is disposed at a third vertical level LV3 as the interface is farther away from the plurality of bonding pads 310 and is progressively raised. The first vertical level LV1 may be disposed at a vertical level that is higher than the second vertical level LV2 and lower than the third vertical level LV3.

With respect to a bottom surface of the pad conductive layer 312M contacting the rear insulation material portion 304D, upper portions of the bonding insulation material layer 300a, the bonding pad 310, and the bonding thermal pad 340 may respectively be the front insulation material portion 302D and the bonding insulation material portion 306D, the pad portion 312D, and the front thermal pad portion 342D, and lower portions of the bonding insulation material layer 300a, the bonding pad 310, and the bonding thermal pad 340 may respectively be the bottom insulation material portion 304D, the through via portion 314D, and the rear thermal pad portion 344D.

On the second chip pad 250, a portion of the second inter-wiring insulation layer 236 covering the second chip pad 250 may have a first thickness T1. A sum of thicknesses of a portion of the front insulation material portion 302D and a portion of the bonding insulation material portion 306D may have a second thickness T2a. The first thickness T1 may be greater than the second thickness T2a. For example, the first thickness T1 may be about 1.5 μm to about 3 μm, and the second thickness T2a may be about 0.5 μm to about 1.2 μm. The pad portion 312D may have a first vertical height H1. The first vertical height H1 may have the same value as a sum of the first thickness T1 and the second thickness T2.

The lowermost bonding insulation material layer 300aL may include a recess 300R at a portion of an upper portion thereof so that a thickness of a portion, overlapping the lowermost second semiconductor chip 200L in the vertical direction, of the lowermost bonding insulation material layer 300aL is greater than a thickness of a portion, which does not overlap the lowermost second semiconductor chip 200L in the vertical direction, of the lowermost bonding insulation material layer 300aL. The recess 300R may be disposed at a portion, which does not overlap the lowermost second semiconductor chip 200L in the vertical direction, of the lowermost bonding insulation material layer 300aL. The lowermost bonding insulation material layer 300aL may include a flat bottom surface, and may have a shape where a center portion (i.e., a portion overlapping the lowermost second semiconductor chip 200L in the vertical direction) of the lowermost bonding insulation material layer 300aL protrudes more upward than an edge portion (i.e., a portion which does not overlap the lowermost second semiconductor chip 200L in the vertical direction) of the lowermost bonding insulation material layer 300aL.

The lowermost bonding insulation material layer 300aL may cover all of a portion, which does not overlap the lowermost second semiconductor chip 200L in the vertical direction, of the top surface of the first semiconductor chip 100. The lowermost bonding insulation material layer 300aL may cover a top surface of the first semiconductor chip 100 and a bottom surface of the lowermost second semiconductor chip 200L. The other bonding insulation material layer 300a, except the lowermost bonding insulation material layer 300aL, may cover a top surface and a bottom surface of the second semiconductor chip 200 facing each other along with the plurality of bonding pads 310.

The front insulation material portion 302D and the bonding insulation material portion 306D of each of the plurality of bonding insulation material layers 300a, disposed between the first semiconductor chip 100 and the lowermost second semiconductor chip 200L and between two adjacent second semiconductor chips 200 of the plurality of second semiconductor chips 200, may have substantially the same horizontal width. The rear insulation material portion 304D of each of the plurality of bonding insulation material layers 300a, disposed between two adjacent second semiconductor chips 200 of the plurality of second semiconductor chips 200, may have substantially the same horizontal width. A horizontal width of the lowermost rear insulation material portion 304DL of the lowermost bonding insulation material layer 300aL disposed between the first semiconductor chip 100 and the lowermost second semiconductor chip 200L may be greater than a horizontal width of the other rear insulation material portion 304D. A horizontal width of the other rear insulation material portion 304D except the lowermost rear insulation material portion 304DL may be substantially the same as a horizontal width of the front insulation material portion 302D of each of the plurality of bonding insulation material layers 300a.

Figure 14A:
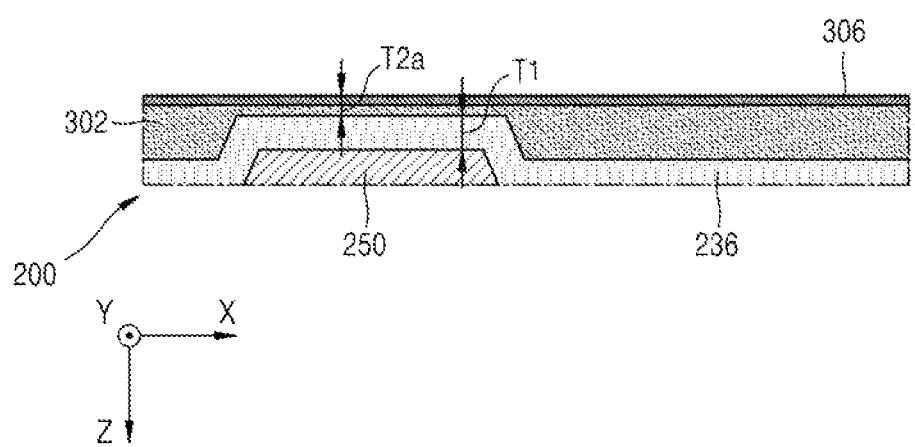
FIGS. 14A and 14B are partially enlarged cross-sectional views illustrating a method of manufacturing a semiconductor chip included in a semiconductor package, according to an example embodiment.
Figure 14B:
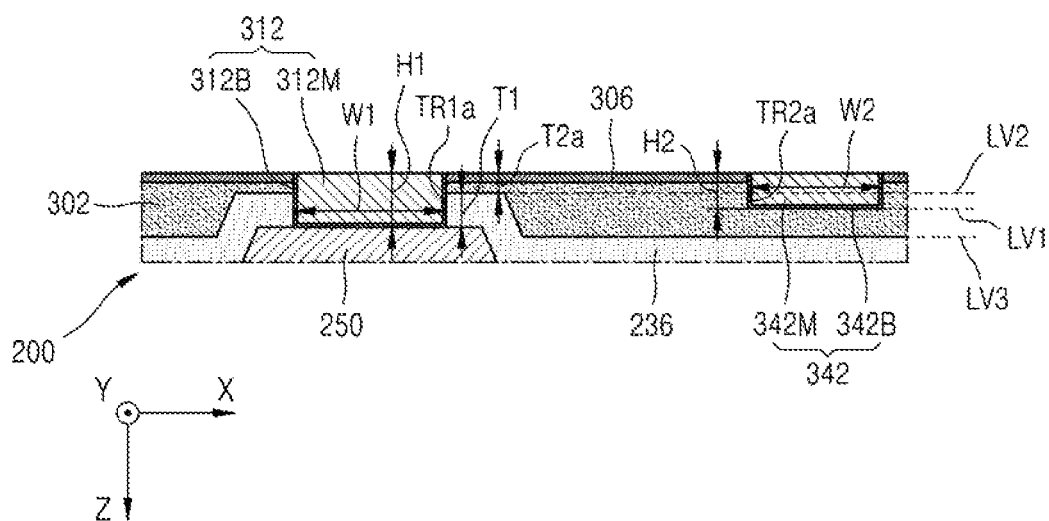

FIGS. 14A and 14B are partially enlarged cross-sectional views illustrating a method of manufacturing a semiconductor chip included in a semiconductor package, according to an example embodiment.

In detail, FIGS. 14A and 14B are partially enlarged cross-sectional views illustrating a portion corresponding to a portion of a front surface of a second semiconductor chip included in a semiconductor package, and are cross-sectional views illustrating a vertically reversed portion of a portion corresponding to a portion of a lower portion of the second semiconductor chip 200 illustrated in the region XIIIB or region XIIIC of FIG. 13A.

Referring to FIG. 14A, a second semiconductor chip 200 may be prepared in which a second inter-wiring insulation layer 236 surrounds a second chip pad 250 and covers a top surface of the second chip pad 250. Then, a front insulation material layer 302 and a junction insulation material layer 306, each covering the second inter-wiring insulation layer 236, may be sequentially formed on the second semiconductor chip 200. The front insulation material layer 302 may be formed to include a flat top surface, and the junction insulation material layer 306 may conformally cover the front insulation material layer 302, and thus, may be formed to include a flat top surface.

Referring to FIG. 14B, by removing a portion of the junction insulation material layer 306, a portion of the front insulation material layer 302, and a portion of the second inter-wiring insulation layer 236, a first trench TR1a may be formed on the second chip pad 250. Then, a front pad 312 filing the first trench TR1a may be formed. In a portion spaced apart from the second chip pad 250, a second trench TR2a (including a bottom surface at which a portion of the front insulation material layer 302 is exposed) may be formed by removing another portion of the junction insulation material layer 306 and another portion of the front insulation material layer 302 so as not to expose the second inter-wiring insulation layer 236. Then, a front thermal pad layer 342 filling the second trench TR2a may be formed.

A top surface of each of the junction insulation material layer 306, a pad barrier layer 312B, a pad conductive layer 312M, a front thermal barrier layer 342B, and a front thermal conductive layer 342M may be formed to configure a coplanar surface. A bottom surface of the front thermal pad layer 342 (i.e., a bottom surface of the second trench TR2a) may be formed to be disposed at a first vertical level LV1, and an interface between the second inter-wiring insulation layer 236 and the front insulation material layer 302 may be formed to have a highest vertical level, which is adjacent to a plurality of bonding pads 310 and is disposed at a second vertical level LV2, and a lowest vertical level that is progressively lowered to be farther away from the plurality of bonding pads 310 and is disposed at a third vertical level LV3. The first vertical level LV1 may be disposed at a vertical level that is lower than the second vertical level LV2 and higher than the third vertical level LV3.

Subsequently, by using the semiconductor chip (i.e., the first semiconductor chip 100 and the second semiconductor chip 200) manufactured by the manufacturing method described above with reference to FIGS. 14A, 14B, and 13A to 13I, the semiconductor package 1000a may be formed by the manufacturing method described above with reference to FIGS. 4A to 12.

Figure 15:
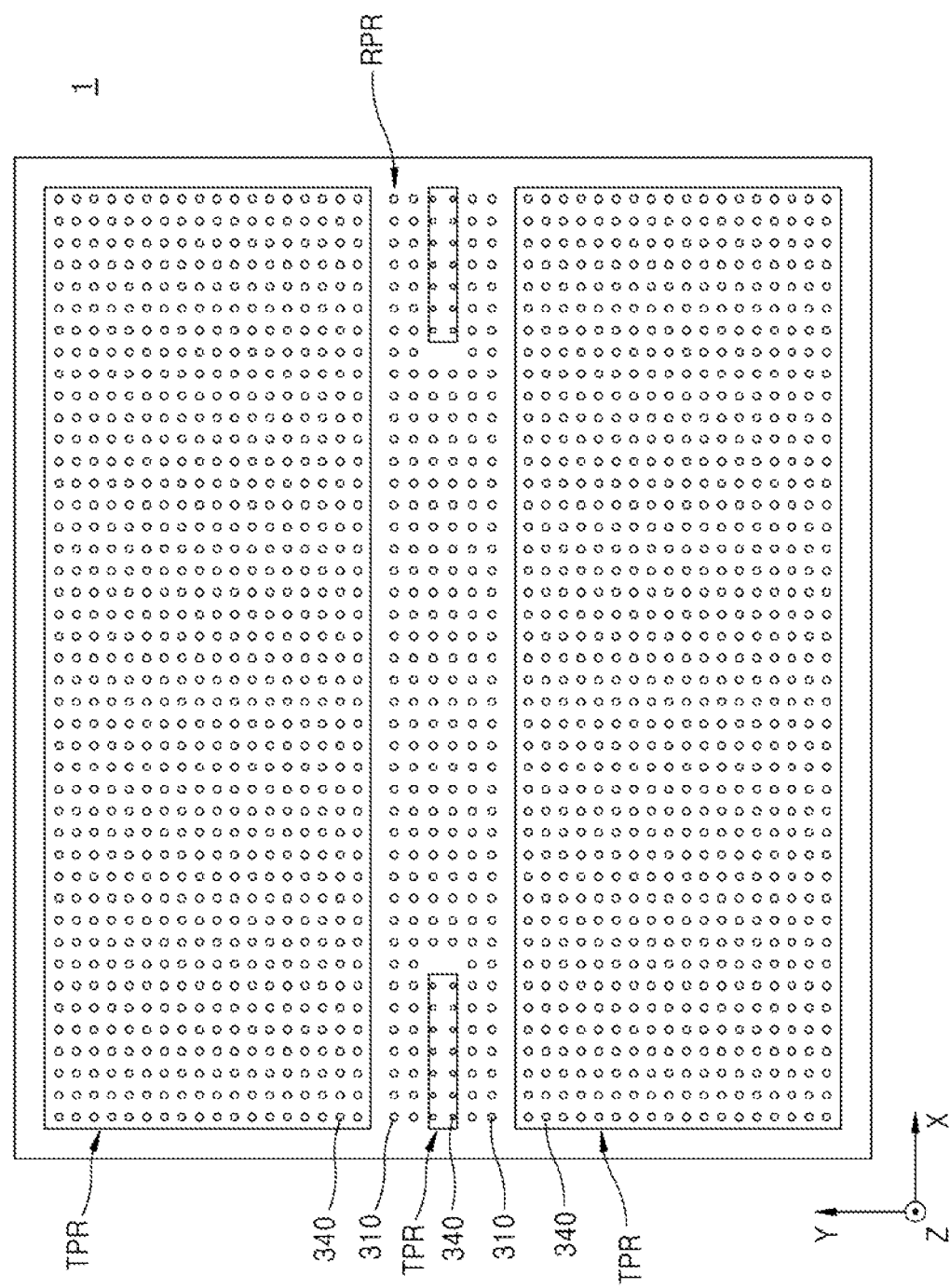
FIG. 15 is a plan view illustrating an arrangement of a bonding pad and a bonding thermal pad each included in a semiconductor package, according to an example embodiment.

FIG. 15 is a plan view illustrating an arrangement of a bonding pad and a bonding thermal pad each included in a semiconductor package 1, according to an example embodiment.

Referring to FIG. 15, the semiconductor package 1 may include a pad region RPR and a thermal pad region TPR. The semiconductor package 1 may be the semiconductor package 1000 illustrated in FIGS. 1A and 1B or the semiconductor package 1000a illustrated in FIGS. 13A and 13B. A bonding pad 310 may be disposed in the pad region RPR. The bonding thermal pad 340 may be disposed in the thermal pad region TPR. The bonding pad 310 may include a center pad arranged along a near-center portion of the first semiconductor chip 100 and the second semiconductor chip 200 each illustrated in FIGS. 1A and 1B or 13A and 13B one-dimensionally.

A horizontal width of the bonding thermal pad 340 may be less than a horizontal width of the bonding pad 310. The horizontal width of the bonding thermal pad 340 may be about 0.5 to about 1.5 times a horizontal width of a through via portion 314D of the bonding pad 310 illustrated in FIGS. 1A and 1B or 13A and 13B. The horizontal width of the bonding thermal pad 340 may be less than a horizontal width of the through via portion 314D of the bonding pad 310, or the horizontal width of the bonding thermal pad 340 may be greater than the horizontal width of the through via portion 314D of the bonding pad 310.

A ratio occupied by a plurality of bonding thermal pads 340 in the semiconductor package 1 may be about 5% to about 50% one-dimensionally, e.g., a the ratio occupied by the plurality of bonding thermal pads 340 in the semiconductor package 1 may be about 5% to about 15% one-dimensionally. For example, when the ratio occupied by the plurality of bonding thermal pads 340 in the semiconductor package 1 is about 5.6% one-dimensionally, a thermal resistance may be reduced by the bonding insulation material layer 300 (described above with reference to FIGS. 1A and 1B) and a thermal resistance may decrease by about 10% between the first semiconductor chip 100 and a lowermost second semiconductor chip 200L and between two adjacent second semiconductor chips 200. When the ratio occupied by the plurality of bonding thermal pads 340 is about 12.6% one-dimensionally, a thermal resistance may decrease by about 14%.

Therefore, in the semiconductor package 1 according to an embodiment, heat dissipation performance may be improved, and operation reliability may be enhanced.

As described above, embodiments relate to a semiconductor package including stacked semiconductor chips, which may exhibit enhanced operation reliability, and a method of manufacturing the semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
  a first semiconductor chip comprising:
    a first semiconductor substrate comprising:
      a first active surface; and
      a first inactive surface opposite to the first active surface; and
    a plurality of first chip pads disposed on the first active surface;
  a second semiconductor chip comprising:
    a second semiconductor substrate comprising:
      a second active surface; and
      a second inactive surface opposite to, the second active surface; and
    a plurality of second chip pads disposed on the second active surface, wherein the second semiconductor chip is disposed on the first semiconductor chip with the second active surface of the second semiconductor chip facing the first inactive surface of the first semiconductor chip;
  an inter-wiring insulation layer surrounding the plurality of second chip pads;
  a bonding insulation material layer interposed between the first semiconductor chip and the second semiconductor chip, the bonding insulation material layer comprising:
    a front insulation material portion;
    a rear insulation material portion disposed below the front insulation material portion in a vertical direction perpendicular to the first semiconductor substrate and the second semiconductor substrate; and a bonding insulation material portion disposed such that the front insulation material portion, the bonding insulation material portion, and the rear insulation material portion are stacked along the vertical direction, wherein the bonding insulation material portion includes a material that differs from a material of the front insulation material portion and a material of the rear insulation material portion;

a plurality of bonding pads that electrically connect the first semiconductor chip to the second semiconductor chip, each bonding pad of the plurality of bonding pads comprising:
　a pad portion on a respective one of the plurality of second chip pads, wherein the pad portion is surrounded by the inter-wiring insulation layer, the front insulation material portion, and the bonding insulation material portion; and
　a through via portion passing through the first semiconductor substrate and having a horizontal width which is less than a horizontal width of the pad portion, wherein at least part of the through via portion is surrounded by the rear insulation material portion.

2. The semiconductor package in of claim 1, further comprising a first inter-wiring insulation layer surrounding the plurality of first chip pads, wherein:
the inter-wiring insulation layer surrounding the plurality of second chip pads is a second inter-wiring insulation layer,
the bonding insulation material layer is interposed between the first inactive surface and the second inter-wiring insulation layer, and
the plurality of bonding pads pass through the second inter-wiring insulation layer and the bonding insulation material layer.

3. The semiconductor package in of claim 1, wherein:
the pad portion is surrounded by the second inter-wiring insulation layer and a portion of the bonding insulation material layer, and
the through via portion is surrounded by another portion of the bonding insulation material layer.

4. The semiconductor package of claim 1, further comprising a plurality of bonding thermal pads surrounded by the bonding insulation material layer.

5. The semiconductor package of claim 4, wherein a horizontal width of each of the plurality of bonding thermal pads is less than a horizontal width of each of the plurality of bonding pads.

6. The semiconductor package of claim 4, wherein a portion; of the bonding insulation material layer that surrounds the plurality of bonding pads is thicker along the vertical direction than a portion, of the bonding insulation material layer that surrounds the plurality of bonding thermal pads.

7. The semiconductor package of claim 4, wherein:
each bonding thermal pad of the plurality of bonding thermal pads comprises:
　a front thermal pad portion surrounded by the front insulation material portion; and
　a rear thermal pad portion surrounded by the rear insulation material portion, the front thermal pad portion and the rear thermal pad portion being provided as one body; and
a vertical height of the front thermal pad portion along the vertical direction is less than a vertical height of the pad portion.

8. The semiconductor package of claim 1, wherein:
a horizontal width of the first semiconductor chip is greater than a horizontal width of the second semiconductor chip;
the bonding insulation material has an overlap portion that overlaps, the second semiconductor chip in the vertical direction and an edge portion that does not overlap the second semiconductor chip in the vertical direction; and
the overlap portion has a thickness that is greater than a thickness of the edge portion.

9. The semiconductor package of claim 1, wherein the front insulation material has a surface, having a concave portion for each second chip pad of the plurality of second chip pads.

10. The semiconductor package of claim 4, wherein the plurality of bonding pads are diffusion-bonded to plurality of bonding thermal pads.

11. A semiconductor package, comprising:
a High Bandwidth Memory (HBM) control die comprising:
　a first semiconductor substrate comprising:
　　a first active surface; and
　　a first inactive surface opposite to, the first active surface; and
　a plurality of first chip pads disposed on the first active surface;
a dynamic random-access memory (DRAM) die comprising:
　a second semiconductor substrate comprising:
　　a second active surface; and
　　a second inactive surface opposite to the second active surface; and
　a plurality of second chip pads disposed on the second active surface, wherein the DRAM die is disposed on the HBM control die with the second active surface of the DRAM die facing the first inactive surface of the HBM control die, and wherein the DRAM die has a horizontal width that is less than a horizontal width of the HBM control die;
an inter-wiring insulation layer surrounding the plurality of second chip pads;
a bonding insulation material layer disposed between the HBM control die and the DRAM die, the bonding insulation material layer comprising:
　a front insulation material portion;
　a rear insulation material portion disposed below the front insulation material portion in a vertical direction perpendicular to the first semiconductor substrate and the second semiconductor substrate; and
　a bonding insulation material portion disposed such that the front insulation material portion, the bonding insulation material portion, and the rear insulation material portion are stacked along the vertical direction, wherein the bonding insulation material portion includes a material that differs from a material of the front insulation material portion and a material of the rear insulation material portion;
a plurality of bonding pads that electrically connect the HBM control die to the DRAM die, wherein each bonding pad of the plurality of bonding pads comprises:
　a pad portion on a respective one of the second chip pads and having a first horizontal width, wherein the pad portion is surrounded by the inter-wiring insulation layer, the front insulation material portion, and the bonding insulation material portion; and a through via portion passing through at least a portion of the first semiconductor substrate or at least a portion of the second semiconductor substrate and having a second horizontal width that is less than the first horizontal width, wherein at least part of the through via portion is surrounded by the rear insulation material portion; and a plurality of bonding thermal pads surrounded by the bonding insulation material layer, wherein each bonding thermal pad of the plurality of bonding thermal pads has a third horizontal width, and wherein the first horizontal width is greater than the third horizontal width.

12. The semiconductor package of claim 11, wherein each bonding thermal pad of the plurality of bonding thermal pads is fully covered by the bonding insulation material layer.

13. The semiconductor package claim 11, wherein:
the bonding insulation material layer covers the inter-wiring insulation layer; and
the plurality of bonding pads pass through the inter-wiring insulation layer and the bonding insulation material layer, and contact the plurality of second chip pads.

14. The semiconductor package of claim 11, the plurality of bonding pads are disposed higher along the vertical direction than the plurality of bonding thermal pads.

15. The semiconductor package of claim 11, wherein:
the bonding insulation material layer has an overlap portion that overlaps the DRAM die and an edge portion that does not overlap the DRAM die;
the bonding insulation material layer comprises a bottom surface and an upper surface disposed higher along the vertical direction than the bottom surface; and
the bottom surface protrudes more upward along the vertical direction at the overlap portion than at the edge portion.

16. The semiconductor package of claim 11, wherein the first horizontal width of the pad portion is two or more times larger than the second horizontal width of the through via portion.

17. A semiconductor package, comprising:
a first semiconductor chip comprising:
a first semiconductor substrate comprising:
a first active surface; and
a first inactive surface opposite to the first active surface;
a plurality of first chip pads disposed on the first active surface; and
a first inter-wiring insulation layer surrounding the plurality of first chip pads;
a second semiconductor chip comprising:
a second semiconductor substrate comprising:
a second active surface; and
a second inactive surface opposite to the second active surface;
a plurality of second chip pads disposed on the second active surface; and
a second inter-wiring insulation layer surrounding the plurality of second chip pads, wherein the second semiconductor chip is disposed on the first semiconductor chip with the second active surface of the second semiconductor chip facing the first inactive surface of the first semiconductor chip, and wherein the second semiconductor chip has a horizontal width that is less than a horizontal width of the first semiconductor chip;

a bonding insulation material layer disposed between the first inactive surface of the first semiconductor chip and the second inter-wiring insulation layer of the second semiconductor chip, the bonding insulation material layer comprising:
a front insulation material portion;
a rear insulation material portion disposed below the front insulation material portion in a vertical direction perpendicular to the first semiconductor substrate and the second semiconductor substrate; and
a bonding insulation material portion disposed such that the front insulation material portion, the bonding insulation material portion, and the rear insulation material portion are stacked along the vertical direction, wherein the bonding insulation material portion includes a material that differs from a material of the front insulation material portion and a material of the rear insulation material portion;

a plurality of bonding pads that electrically connecting the first semiconductor chip to the second semiconductor chip, wherein each of the plurality of bonding pads comprises:
a pad portion on a respective one of the second chip pads and having a first horizontal width, wherein the pad portion is surrounded by the second inter-wiring insulation layer, the front insulation material portion, and the bonding insulation material portion; and
a through via portion passing through at least a portion of the first semiconductor substrate or at least a portion of the second semiconductor substrate and having a second horizontal width that is less than the first horizontal width, wherein at least part of the through via portion is surrounded by the rear insulation material portion; and a plurality of bonding thermal pads surrounded by the bonding insulation material layer and disposed apart from the plurality of bonding pads in a horizontal direction that is perpendicular to the vertical direction, wherein:
each bonding thermal pad of the plurality of bonding thermal pads has a third horizontal width;
the second horizontal width is greater than the third horizontal width; and
a portion of the bonding insulation material layer that surrounds the plurality of bonding pads is thicker along the vertical direction than a portion of the bonding insulation material layer that surrounds the plurality of the bonding thermal pads.

18. The semiconductor package of claim 17, wherein:
a material of the plurality of bonding pads and the plurality of bonding thermal pads comprises copper (Cu); and
a material of the bonding insulation material layer comprises silicon oxide.

19. The semiconductor package of claim 17, wherein the first horizontal width is about 6 μm to about 12 μm, and the second horizontal width is about 2 μm to about 6 μm.

* * * * *